(12) United States Patent
Zhang et al.

(10) Patent No.: US 12,035,573 B2
(45) Date of Patent: Jul. 9, 2024

(54) ORGANIC LIGHT-EMITTING DISPLAY PANEL AND ORGANIC LIGHT-EMITTING DISPLAY DEVICE INCLUDING SUB-MICROLENSES

(71) Applicants: WUHAN TIANMA MICRO-ELECTRONICS CO., LTD., Wuhan (CN); Wuhan Tianma Microelectronics Co., Ltd. Shanghai Branch, Shanghai (CN)

(72) Inventors: Guofeng Zhang, Wuhan (CN); Junqiang Wang, Wuhan (CN); Jiaxin Li, Wuhan (CN); Quanpeng Yu, Shanghai (CN)

(73) Assignees: WUHAN TIANMA MICRO-ELECTRONICS CO., LTD., Wuhan (CN); Wuhan Tianma Microelectronics Co., Ltd. Shanghai Branch, Shanghai (CN)

( * ) Notice: Subject to any disclaimer, the term of this patent is extended or adjusted under 35 U.S.C. 154(b) by 0 days.

(21) Appl. No.: 18/073,393

(22) Filed: Dec. 1, 2022

(65) Prior Publication Data
US 2023/0097697 A1    Mar. 30, 2023

Related U.S. Application Data

(63) Continuation of application No. 16/941,386, filed on Jul. 28, 2020, now Pat. No. 11,545,530.

(30) Foreign Application Priority Data

Jun. 4, 2020  (CN) .......................... 202010501372.8

(51) Int. Cl.
*H10K 59/12*     (2023.01)
*H10K 50/84*     (2023.01)
(Continued)

(52) U.S. Cl.
CPC ......... *H10K 59/122* (2023.02); *H10K 50/844* (2023.02); *H10K 50/858* (2023.02);
(Continued)

(58) Field of Classification Search
CPC .. H10K 50/844; H10K 50/858; H10K 50/865; H10K 59/122; H10K 59/38;
(Continued)

(56) References Cited

U.S. PATENT DOCUMENTS

| | | |
|---|---|---|
| 11,005,153 B1 | 5/2021 | Zhu et al. |
| 2011/0175118 A1 | 7/2011 | Hori et al. |

(Continued)

FOREIGN PATENT DOCUMENTS

| | | |
|---|---|---|
| CN | 102440068 A | 5/2012 |
| CN | 102832227 A | 12/2012 |

(Continued)

OTHER PUBLICATIONS

State Intellectual Property Office of the People's Republic of China, First Office Action, Chinese Patent Application No. 202010501372.8, Mailed Jul. 19, 2022, 9 pages.

*Primary Examiner* — Ida M Soward
(74) *Attorney, Agent, or Firm* — CHRISTENSEN O'CONNOR JOHNSON KINDNESS PLLC

(57) ABSTRACT

An organic light-emitting display panel has a display area and a non-display area and includes a base substrate, an organic light-emitting layer arranged at a side of the base substrate and including a plurality of light-emitting units, a pixel definition layer including a plurality of first openings, and a microlens layer arranged at a side of the pixel definition layer facing away from the base substrate and including at least one first sub-microlens. One light-emitting unit of the plurality of light-emitting units is located in one of the plurality of first openings. One first sub-microlens of (Continued)

the at least one first sub-microlens protrudes along a direction from the base substrate to the microlens layer. An orthogonal projection of one first sub-microlens of the at least one first sub-microlens on the base substrate overlaps with an orthogonal projection of the pixel definition layer on the base substrate.

20 Claims, 14 Drawing Sheets

(51) Int. Cl.
| | |
|---|---|
| *H10K 50/844* | (2023.01) |
| *H10K 50/85* | (2023.01) |
| *H10K 50/858* | (2023.01) |
| *H10K 50/86* | (2023.01) |
| *H10K 59/122* | (2023.01) |
| *H10K 59/38* | (2023.01) |
| *H10K 59/40* | (2023.01) |
| *G02F 1/1333* | (2006.01) |
| *G02F 1/1335* | (2006.01) |
| *G02F 1/1362* | (2006.01) |
| *H01L 27/146* | (2006.01) |
| *H01L 33/22* | (2010.01) |
| *H01L 33/24* | (2010.01) |
| *H10K 102/00* | (2023.01) |

(52) U.S. Cl.
CPC ........... *H10K 50/865* (2023.02); *H10K 59/38* (2023.02); *H10K 59/40* (2023.02); *G02F 1/133331* (2021.01); *G02F 1/133512* (2013.01); *G02F 1/136209* (2013.01); *H01L 27/14678* (2013.01); *H01L 33/22* (2013.01); *H01L 33/24* (2013.01); *H10K 2102/00* (2023.02); *H10K 2102/311* (2023.02)

(58) Field of Classification Search
CPC ........ H10K 59/40; H10K 59/50; H10K 59/12; H10K 2102/00; H10K 2102/311; H01L 33/22; H01L 33/24; H01L 27/14678; G02F 1/133331; G02F 1/133512; G02F 1/136209

See application file for complete search history.

(56) References Cited

U.S. PATENT DOCUMENTS

| | | | |
|---|---|---|---|
| 2014/0291648 A1* | 10/2014 | Yamazaki | H10K 50/813 |
| | | | 257/40 |
| 2015/0042926 A1 | 2/2015 | Akasaka | |
| 2015/0179987 A1 | 6/2015 | Ma et al. | |
| 2015/0372065 A1 | 12/2015 | Yamazaki | |
| 2017/0025486 A1* | 1/2017 | Kwon | H10K 50/8428 |
| 2017/0358642 A1 | 12/2017 | Jo et al. | |
| 2018/0033848 A1* | 2/2018 | Jung | H10K 59/124 |
| 2018/0182817 A1 | 6/2018 | Jo et al. | |
| 2019/0181838 A1 | 6/2019 | Forrest et al. | |
| 2019/0198593 A1* | 6/2019 | Jo | H10K 50/818 |
| 2020/0058721 A1* | 2/2020 | Sim | H10K 50/858 |
| 2020/0212114 A1 | 7/2020 | Song | |
| 2021/0288116 A1 | 9/2021 | Xu | |
| 2021/0335945 A1 | 10/2021 | Yang | |
| 2021/0408127 A1 | 12/2021 | Zhang | |
| 2022/0006057 A1 | 1/2022 | Itonaga | |

FOREIGN PATENT DOCUMENTS

| | | | | |
|---|---|---|---|---|
| CN | 110235520 A | | 9/2019 | |
| CN | 110690363 A | | 1/2020 | |
| CN | 111029381 A | * | 4/2020 | ........ H01L 27/3225 |
| JP | 2003264059 A | * | 9/2003 | |

\* cited by examiner

ORGANIC LIGHT-EMITTING DISPLAY PANEL AND ORGANIC LIGHT-EMITTING DISPLAY DEVICE INCLUDING SUB-MICROLENSES

CROSS-REFERENCE TO RELATED APPLICATIONS

This application is a continuation of U.S. patent application Ser. No. 16/941,386, filed on Jul. 28, 2020, which claims priority to Chinese Patent Application No. 202010501372.8, filed on Jun. 4, 2020. All of the above-mentioned patent applications are hereby incorporated by reference in their entireties.

FIELD

The present disclosure relates to display technology, and more particularly, to an organic light-emitting display panel, and an organic light-emitting display device.

BACKGROUND

Compared with liquid crystal display panels, organic light-emitting display panels have advantages such as being lighter and thinner, having higher luminance, lower power consumption, quicker response, higher definition, better flexibility, and higher luminous efficiency. The organic light-emitting display panels have gradually become the mainstream display technology. The luminescence principle of the organic light-emitting display is as follows. Holes generated by an anode and the electrons generated by a cathode of an organic light-emitting element are driven to move by an electric field. The holes and electrons are injected into a hole transport layer and an electron transport layer, respectively, and migrate to an organic light-emitting material layer. When the holes and electrons meet in the organic light-emitting material layer, energy exciton is generated, and thus light-emitting molecules in the organic light-emitting material layer are excited to generate visible light.

The organic light-emitting display panel includes multiple layers with different refractive indexes, which causes light emitted by a pixel to be reflected and refracted in many paths and cannot be emitted from directly above the pixel, affecting the luminance. In addition, light reflected and refracted at a large angle may reach adjacent pixels, causing a color mixing.

SUMMARY

In view of the above, the present disclosure provides an organic light-emitting display panel and an organic light-emitting display device.

In one aspect, an embodiment of the present disclosure provides an organic light-emitting display panel having a display area and a non-display area. The organic light-emitting display panel includes a base substrate, an organic light-emitting layer, a pixel definition layer, and a microlens layer. The organic light-emitting layer is arranged at a side of the base substrate and includes a plurality of light-emitting units. The pixel definition layer includes a plurality of first openings, and one light-emitting unit of the plurality of light-emitting units is located in one of the plurality of first openings. The microlens layer is arranged at a side of the pixel definition layer facing away from the base substrate and includes at least one first microlens. One first sub-microlens of the at least one first sub-microlens protrudes along a direction from the base substrate to the microlens layer. An orthogonal projection of one first sub-microlens of the at least one first sub-microlens on the base substrate overlaps with an orthogonal projection of the pixel definition layer on the base substrate.

In another aspect, an embodiment of the present disclosure provides an organic light-emitting display device including an organic light-emitting display panel. The organic light-emitting display panel has a display area and a non-display area. The organic light-emitting display panel includes a base substrate, an organic light-emitting layer, a pixel definition layer, and a microlens layer. The organic light-emitting layer is arranged at a side of the base substrate and includes a plurality of light-emitting units. The pixel definition layer includes a plurality of first openings, and one light-emitting unit of the plurality of light-emitting units is located in one of the plurality of first openings. The microlens layer is arranged at a side of the pixel definition layer facing away from the base substrate and includes at least one first microlens. One first sub-microlens of the at least one first sub-microlens protrudes along a direction from the base substrate to the microlens layer. An orthogonal projection of one first sub-microlens of the at least one first sub-microlens on the base substrate overlaps with an orthogonal projection of the pixel definition layer on the base substrate.

BRIEF DESCRIPTION OF DRAWINGS

In order to explain the technical solutions of embodiments of the present disclosure more clearly, the accompanying drawings used in the embodiments are briefly introduced as follows. The drawings described as follows are merely part of the embodiments of the present disclosure, and other drawings can also be acquired according to the drawings by those skilled in the art.

DESCRIPTION OF EMBODIMENTS

For better understanding the technical solutions of the present disclosure, the embodiments of the present disclosure are described in detail below with reference to the accompanying drawings.

It should be noted that the described embodiments are merely some embodiments of the present disclosure, but not all of the embodiments. Other embodiments obtained by those skilled in the art based on the embodiments of the present disclosure are within the protection scope of the present disclosure.

The terms used in the embodiments of the present disclosure are merely for the purpose of describing particular embodiments and not intended to limit the present disclosure. Unless otherwise noted in the context, the singular form expressions "a", "an", "the" and "said" used in the embodiments and appended claims of the present disclosure are also intended to represent a plural form.

It should be understood that the term "and/or" as used herein merely indicates an association relationship to describe the associated object, meaning that there may be three relationships, for example, A and/or B may indicate three cases: A exists individually; A and B exist simultaneously; B exists individually. In addition, the character "I" as used herein generally indicates that the contextual associated objects are in an "or" relationship.

In the description of the present specification, it is to be understood that the terms "substantially", "approximately", "roughly", "about", "basically", "generally", and the like as used in the claims and embodiments of the present disclosure means that it can be generally accepted within a reasonable process operation or within the tolerance range, rather than an exact value.

It should be understood that although the terms first, second, third, etc. can be used to describe the microlenses in the embodiments of the present disclosure, these microlenses should not be limited to these terms. These terms are only used to distinguish microlenses from each other. For example, the first microlens can also be referred to as a second microlens and, similarly, the second microlens can also be referred to as a first microlens without departing from the scope of the embodiments of the present disclosure.

Figure 1:
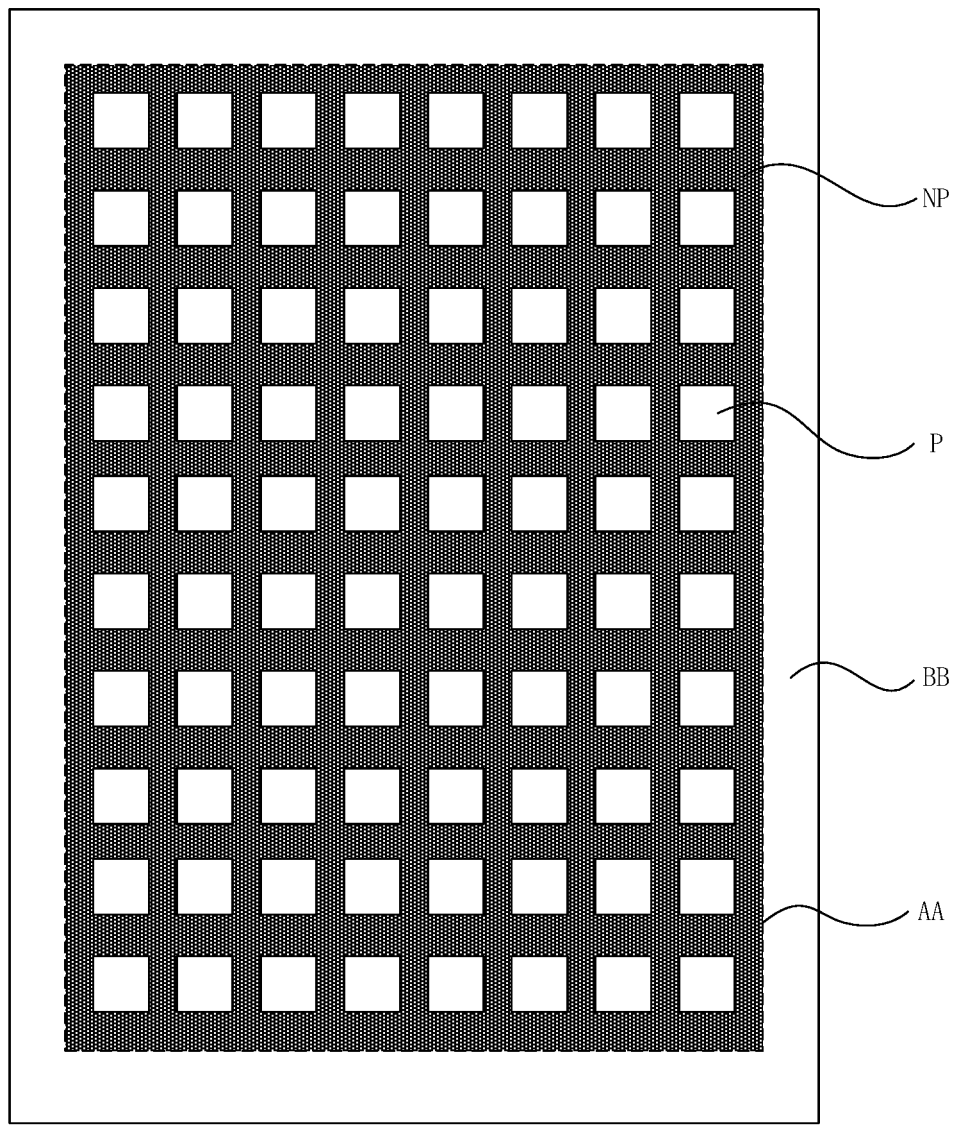
FIG. 1 is a schematic diagram of an organic light-emitting display panel provided in an embodiment of the present disclosure.
Figure 2:
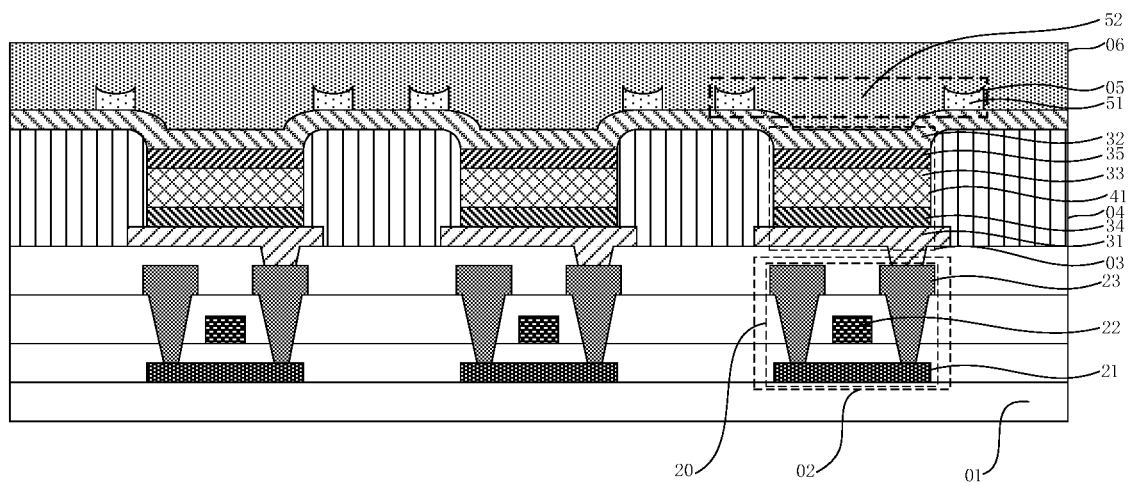
FIG. 2 is a cross-sectional view of a display area of an organic light-emitting display panel provided in an embodiment of the present disclosure.
Figure 3:
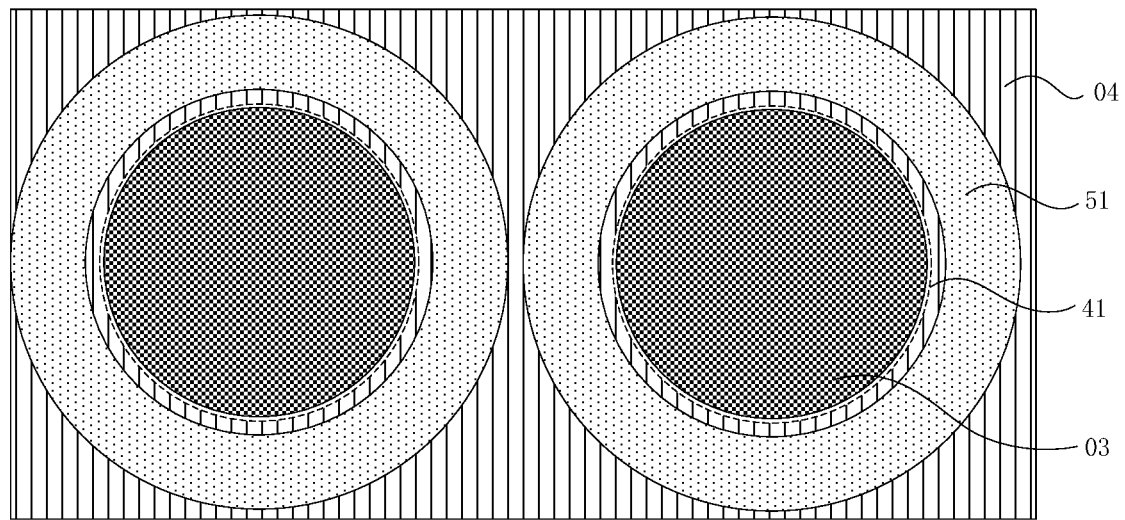
FIG. 3 is a diagram showing an orthogonal projection of an organic light-emitting display panel provided in an embodiment of the present disclosure.

FIG. 1 is a schematic diagram of an organic light-emitting display panel provided in an embodiment of the present disclosure. FIG. 2 is a cross-sectional view of a display area of an organic light-emitting display panel provided in an embodiment of the present disclosure. FIG. 3 is a diagram showing an orthogonal projection of an organic light-emitting display panel provided in an embodiment of the present disclosure.

As shown in FIG. 1, the organic light-emitting display panel provided in an embodiment of the present disclosure has a display area AA and a non-display area BB surrounding the display area AA. The display area AA is a portion for light emitting and display, and the non-display area BB is a portion to set peripheral circuits therein.

As shown in FIG. 2, the organic light-emitting display panel includes a base substrate 01, an organic light-emitting layer, a pixel definition layer 04 and a microlens layer 05 that are located in the display area AA. A thin film transistor layer 02 is provided in the display area AA.

The thin film transistor layer 02 is located at a side of the base substrate 01 close to a light exiting surface of the organic light-emitting display panel and includes multiple thin film transistors 20. The thin film transistor 20 includes an active layer 21, a gate 22, a drain 23 and a source 24.

The organic light-emitting layer is located at a side of the base substrate 01. For example, the organic light-emitting layer is located at a side of the base substrate 01 facing away from the thin layer transistor layer 02. The organic light-emitting layer includes multiple light-emitting units 03, and each light-emitting unit 03 is electrically connected to at least one thin film transistor 20. In an embodiment, as shown in FIG. 2, the light-emitting unit 03 includes an anode 31, a cathode 32, and an organic light-emitting material layer 33 arranged between the anode 31 and the cathode 32. In addition, the light-emitting unit 03 includes a hole transport layer 34 provided between the anode 31 and the organic light-emitting material layer 33, and an electron transport layer 35 provided between the cathode 32 and the organic light-emitting material layer 33. The anode 31 of the light-emitting unit 03 is electrically connected to at least one thin film transistor 20.

The pixel definition layer 04 includes first openings 41, and the light-emitting unit 03 is located in the first opening 41 of the pixel definition layer 04. The light-emitting unit 03 is surrounded by the pixel definition layer 04.

The microlens layer 05 is located at a side of the pixel definition layer 04 facing away from the base substrate 01 and includes at least one first microlens 51. As shown in FIG. 3, an orthogonal projection of the first microlens 51 on the base substrate 01 is located between orthogonal projections of adjacent first openings 41 on the base substrate 01.

That is, the orthogonal projection of the first microlens 51 on the base substrate 01 is located between orthogonal projections of adjacent light-emitting units 03 on the base substrate 01.

The light emitted by the light-emitting unit 03 is generally not collimated light, that is, the light emitted by the light-emitting unit 03 has a certain divergence angle. The light emitted by the light-emitting unit 03 and reaching a position above the peripheral pixel definition layer 04 has a large divergence angle. The large-angle light has a large probability of dissipating after a total reflection or multiple refractions, which affects the light-emitting efficiency of the light-emitting unit 03. The first microlens 51 is provided at a position above the pixel definition layer 04 in a peripheral region of the light-emitting unit 03. The large-angle divergent light emitted by the light-emitting unit is converted into small-angle light through the reflection and refraction of the first microlens 51, and then is emitted from the above of the first microlens 51. In embodiments of the present disclosure, the light emitting amount around the light-emitting unit 03 is increased without changing the front-screen-view optical path of the light-emitting unit 03, thereby improving the light-emitting efficiency of the display panel, reducing the power consumption of the display panel and prolonging the lifetime of the display panel. In addition, the arrangement of the first microlenses 51 can avoid the color mixing caused by the large-angle light entering the adjacent light-emitting unit.

In an embodiment of the present disclosure, as shown in FIG. 2, a refractive index matching layer 06 located at a side of the microlens layer 05 close to the light exiting surface of the organic light-emitting display panel is provided in the display area AA. The refractive index matching layer 06 and the microlens layer 05 are stacked. As shown in FIG. 2, the refractive index matching layer 06 can cover the microlens layer 05. The refractive index matching layer 06 has a refractive index that is different from a refractive index of the first microlens 51. The first microlens 51 has a curved surface that is in contact with the refractive index matching layer 06, the first curved surface protrudes toward one of the first microlens 51 and the refractive index matching layer 06, and the one of the first microlens 51 and the refractive index matching layer 06 has a smaller refractive index.

Figure 4:
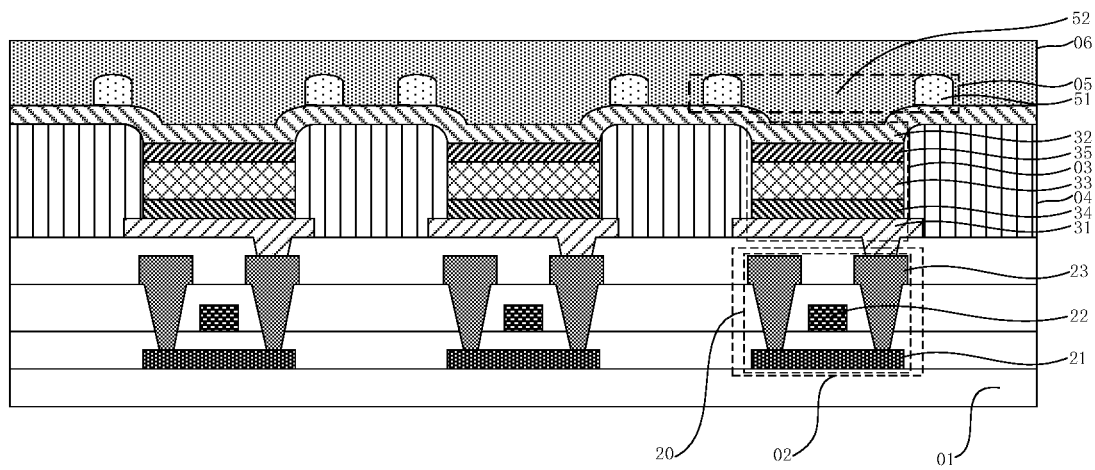
FIG. 4 is a cross-sectional view of a display area of an organic light-emitting display panel provided in an embodiment of the present disclosure.

FIG. 4 is a cross-sectional view of a display area of an organic light-emitting display panel provided in an embodiment of the present disclosure.

As shown in FIG. 2, when the refractive index of the first microlens 51 is smaller than the refractive index of the refractive index matching layer 06, the curved first surface of the first microlens 51 that is in contact with the refractive index matching layer 06 is a curved surface protruding toward the first microlens 51, that is, the first microlens 51 is a concave lens. As shown in FIG. 4, when the refractive index of the refractive index matching layer 06 is smaller than the refractive index of the first microlens 51, the first curved surface of the first microlens 51 that is in contact with the refractive index matching layer 06 is a curved surface protruding toward the refractive index matching layer 06, that is, the first microlens 51 is a convex lens.

Figure 5:
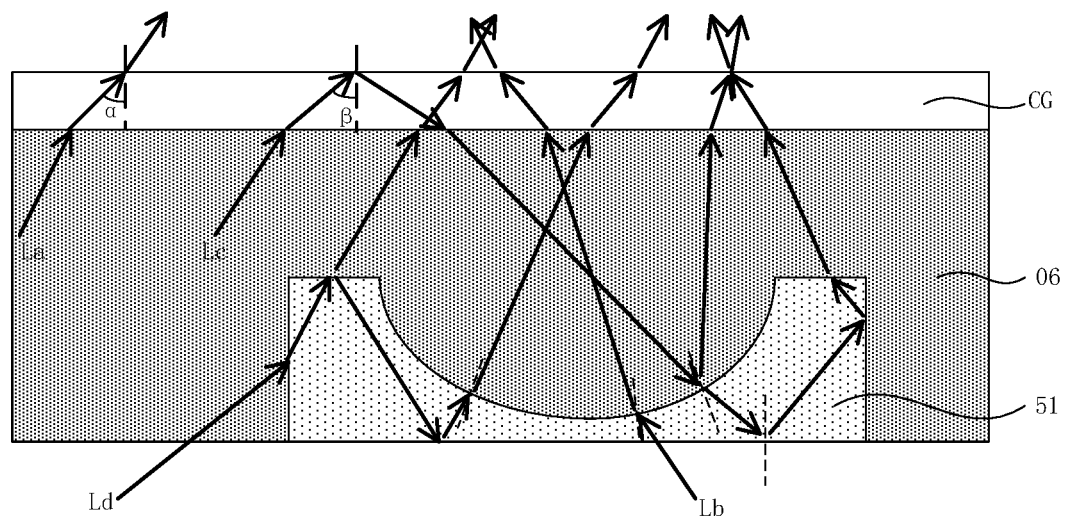
FIG. 5 is a diagram showing a part of an optical path of an organic light-emitting display panel provided in an embodiment of the present disclosure.
Figure 7:
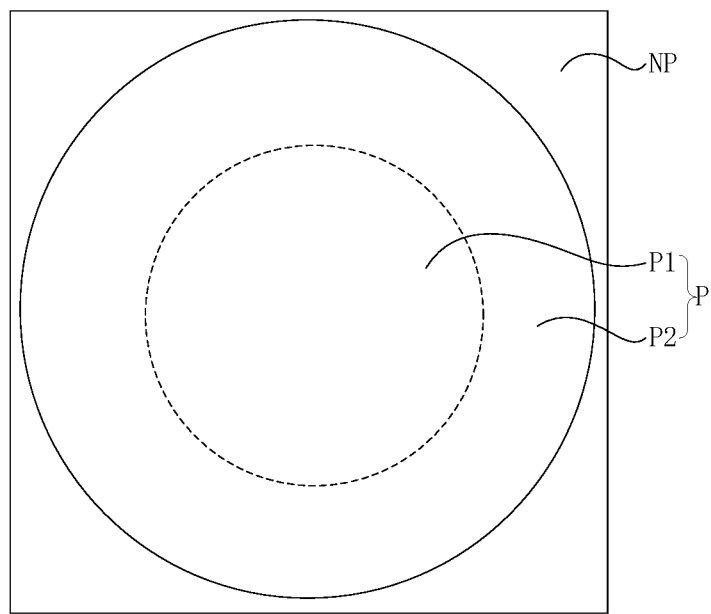
FIG. 7 is a schematic diagram of a light-emitting part provided in an embodiment of the present disclosure.

The effect of the first microlens 51 of the organic light-emitting display panel is described below. FIG. 5 is a diagram showing a part of an optical path of an organic light-emitting display panel provided in an embodiment of the present disclosure. As shown in FIG. 5, the effect of the first microlens 51 is described with an example in which an upper substrate CG is directly disposed on the refractive index matching layer 06 and is a glass cover plate. However, in practical conditions, the refractive index matching layer 06 and the upper substrate CG may not in direct contact with each other, another layer, such as an optical adhesive layer may be provided between the refractive index matching layer 06 and the upper substrate CG, and the upper substrate CG is not necessarily the glass cover plate. The refractive index of the first microlens 51 is smaller than the refractive index of the refractive index matching layer 06. For example, when the upper substrate CG is the glass cover plate, the refractive index of the upper substrate CG is 1.5, the refractive index of air is 1, then a critical angle for the total reflection of the light emitted from the upper substrate CG to the light exiting surface of the organic light-emitting display panel is 41.8°. FIG. 7 illustrates an example in which the first microlens 51 is the concave lens, but when the first microlens 51 is a convex lens and a corresponding refractive index matching layer 06 is provided, the same effect can be achieved.

Referring to FIG. 5, a small-angle light La emitted by the light-emitting unit 03 reaches the glass cover plate without passing through the first microlens 51 at an incidence angle α that is less than 41.8°, and thus no total reflection occurs, and the light is emitted from the upper substrate CG to the outside of the light exiting surface of the display panel. That is, the first microlens 51 does not affect the small-angle light La that does not pass through the first microlens 51, and the small-angle light is normally emitted to the outside of the display panel. A small-angle light Lb emitted by the light-emitting unit 03 passes through the first microlens 51, and is condensed after passing through the first microlens 51 and the refractive index matching layer 06. The light Lb is incident to the upper substrate CG at an incident angle smaller than the incident angle of the light La that directly reaches the upper substrate CG without passing through the first microlens 51 and the refractive index matching layer 06. Therefore, the small-angle light Lb passing through the first microlens 51 can also be normally emitted to the outside of the display panel. A large-angle light Lc can be incident to the upper substrate CG at an incident angle β, and β is greater than 41.8°. The large-angle light Lc that can be incident to the upper substrate CG can be reflected, the reflected light is reflected and converged by the first microlens 51 and then converted into a small-angle light and can be emitted to the outside of the display panel. The large-angle light Ld that cannot be incident to the upper substrate CG can be reflected and converged by the first microlens 51 and then converted into a small-angle light and can be emitted to the outside of the display panel. The large-angle light Lb that can be incident to the upper substrate CG refers to a large-angle light which is emitted by the light-emitting unit 03 and can reach the upper substrate without passing through the first microlens 51. The large-angle light Ld that cannot be incident to the upper substrate CG refers to a large-angle light that is emitted by the light-emitting unit 03 and will disappear after multiple refractions if the large-angle light does not pass through the microlens 51 and the refractive index matching layer 06.

From the above analysis, it can be seen that by providing the first microlens 51 and the refractive index matching layer 06 in the peripheral area of the light-emitting unit 03, the large-angle light can be converted into the small-angle light by the refraction and/or reflection effect of the first microlens 51 and the refractive index matching layer 06 on the large-angle light, therefore reducing the probability of total reflection and improving the light output efficiency.

Figure 6:
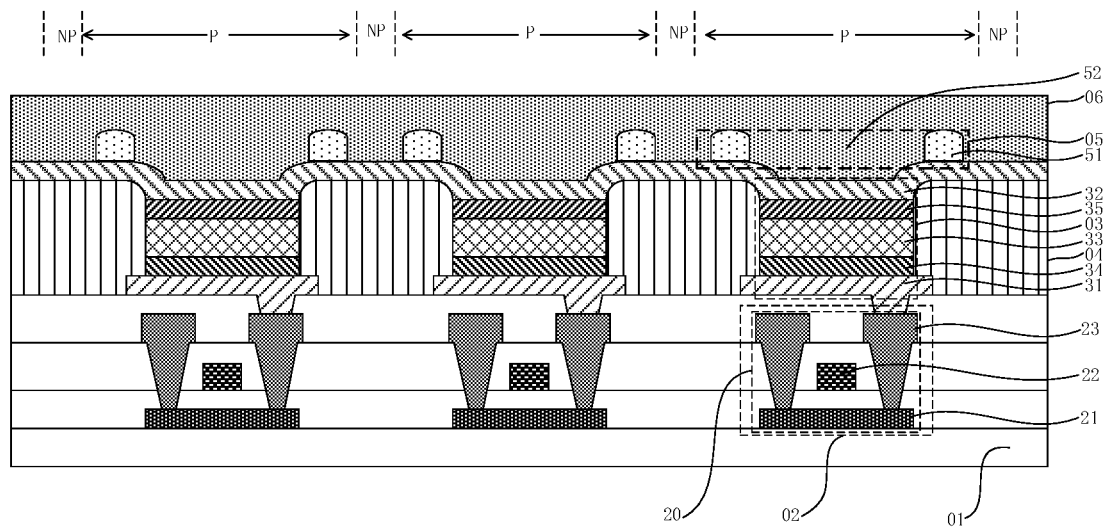
FIG. 6 is a cross-sectional view of a display area of yet another organic light-emitting display panel provided in an embodiment of the present disclosure.
Figure 8:
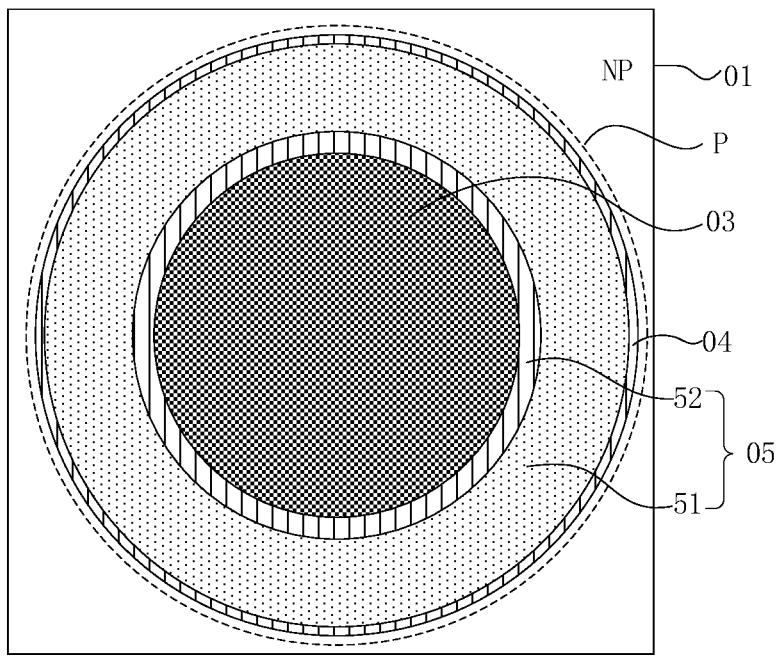
FIG. 8 is a diagram showing an orthogonal projection of a first microlens of an organic light-emitting display panel provided in an embodiment of the present disclosure.
Figure 9:
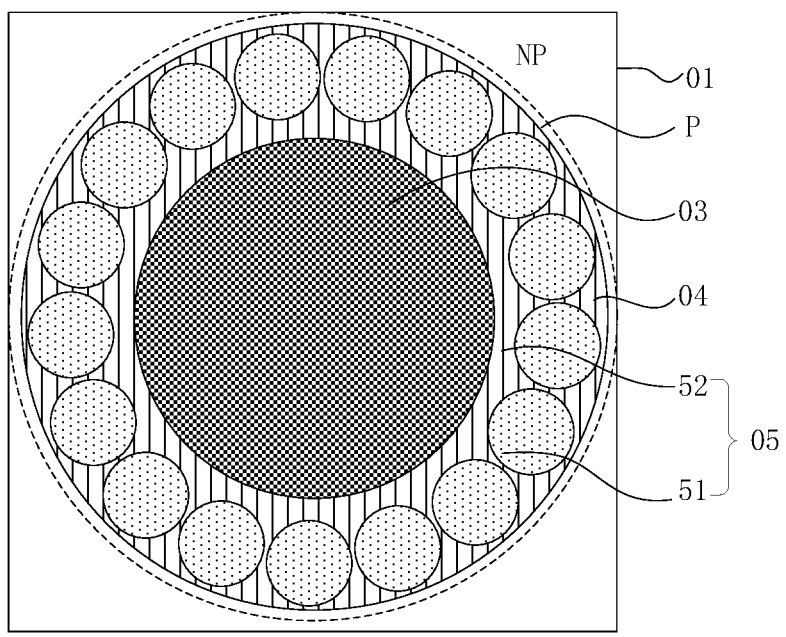
FIG. 9 is a diagram showing an orthogonal projection of a first microlens of an organic light-emitting display panel provided in an embodiment of the present disclosure.

FIG. 6 is a cross-sectional view of a display area of an organic light-emitting display panel provided in an embodiment of the present disclosure. FIG. 7 is a schematic diagram of a light-emitting part provided in one embodiment of the present disclosure. FIG. 8 is a diagram showing an orthogonal projection of a first microlens of an organic light-emitting display panel provided in an embodiment of the present disclosure. FIG. 9 is a diagram showing an orthogonal projection of a first microlens of an organic light-emitting display panel provided in an embodiment of the present disclosure.

Since the light emitted by the light-emitting unit 03 is scattered when the light reaches the light exiting surface, a light-emitting area of each light-emitting unit 03 on the light exiting surface of the display panel is larger than a light-emitting area of the light-emitting unit 03. As shown in FIG. 6, in an embodiment of the present disclosure, the display area AA includes a plurality of light-emitting parts P and non-light-emitting parts NP, and each non-light-emitting part NP is located between adjacent light-emitting parts P. The plurality of light-emitting units 03 in the organic light-emitting layer and the light-emitting parts P are in one-to-one correspondence. In an embodiment, as shown in FIG. 6, the light-emitting part 03 is disposed in the light-emitting part P of the display area AA of the display panel, and at least one first microlens 51 is provided in the light-emitting part P.

As shown in FIG. 7, the light-emitting part P includes a first part P1 and a second part P2 located around the first part P1 and surrounding the first part P1, and the light-emitting unit 03 is provided in the first part P1. The light-emitting unit 03 can be a self-illumination device, that is, the light-emitting unit 03 can generate light, so the first part P1 is a part of the light-emitting part P that is capable of illuminating itself. Since part of light emitted by the light-emitting unit 03 has a divergence angle, and this part of light reaches the light exiting surface of the display panel, so that the size of the light-emitting part P is larger than the size of the light-emitting unit 03. The second part P2 is a part of the light-emitting part P that does not emit light by itself but some light exits from it.

In embodiments of the present disclosure, the light-emitting unit 03 is disposed in the first part P1 of the light-emitting part P, and at least part position of the second part P2 is provided with the first microlens 51. It can be understood that the orthogonal projection of the first microlens 51 on the base substrate 01 is located at a side of the orthogonal projection of the light-emitting unit 03 on the base substrate 01 close to the non-light-emitting part NP. It should be noted that the first microlens 51 is also provided in the light-emitting part P, but the first microlens 51 is located in the second part P2 that is outside the first part P1 corresponding to the light-emitting unit 03, that is, the first microlens 51 is located on the pixel definition layer 04 and is in the second part P2 of the light-emitting part P.

As shown in FIG. 8 and FIG. 9, the orthogonal projection of the first microlens 51 on the base substrate 01 is located at a side of the orthogonal projection of the opening 41 of the pixel definition layer 04 on the base substrate 01 close to the non-light-emitting part NP.

Combining FIG. 2, FIG. 4 and FIG. 6 with FIG. 8 and FIG. 9, the microlens layer 05 further includes second openings 52, and an orthogonal projection of the second opening 52 on the base substrate 01 covers the orthogonal projection of the light-emitting unit 03 on the base substrate 01.

As shown in FIG. 8, the first microlens 51 can be of a ring structure, and the second openings 52 of the microlens layer 05 can correspond to a ring hole corresponding to the ring-structured first microlens 51. The orthogonal projection of the first microlens 51 on the base substrate 01 surrounds the orthogonal projection of the light-emitting unit 03 on the base substrate 01. In some embodiments, the first sub-microlens 54 is of a ring structure, and an orthogonal projection of the first sub-microlens 54 on the base substrate 01 surrounds an orthogonal projection of the light-emitting unit 03 on the base substrate 01.

As shown in FIG. 9, multiple first microlenses 51 are provided in a region located between two adjacent first openings 41, and a first direction is a direction along which the two adjacent first openings 41 are arranged. That is, the microlens layer 05 corresponding to one light emitting part P can include multiple first microlenses 51 that are arranged in a ring. That is, multiple first microlenses 51 are provided in one light-emitting part P and arranged in a ring shape. The second opening 52 of the microlens layer 05 corresponds to a ring-shaped hole formed by an arrangement of the multiple first microlenses 51. The orthogonal projection of the multiple first microlenses 51 on the base substrate 01 surrounds the orthogonal projection of the light-emitting unit 03 on the base substrate 01.

In an embodiment of the present disclosure, the first microlenses 51 corresponding to the light-emitting units 03 are independent from each other. As shown in FIG. 2, FIG. 4, FIG. 6, FIG. 8, and FIG. 9, the first microlenses 51 are discontinuous. For example, as shown in FIG. 8, one light-emitting unit 03 corresponds to one first microlens 51, and the first microlens 51 only surrounds the one light-emitting unit 03 and is not connected to other first microlenses 51 corresponding to other light-emitting units 03. As shown in FIG. 9, one light-emitting unit 03 corresponds to multiple first microlenses 51 which are not connected to each other, and the multiple microlenses 51 only surround this light-emitting unit 03 and are not connected to other first microlenses 51 corresponding to other light-emitting units 03.

The microlens layer 05 includes a hollowed region above the light-emitting unit 03, and the small-angle light emitted by the light-emitting unit 03 can exit without passing through the microlens layer 05, avoiding affecting of the microlens layer 05 on the light emitting angle of the small-angle light.

Figure 10:
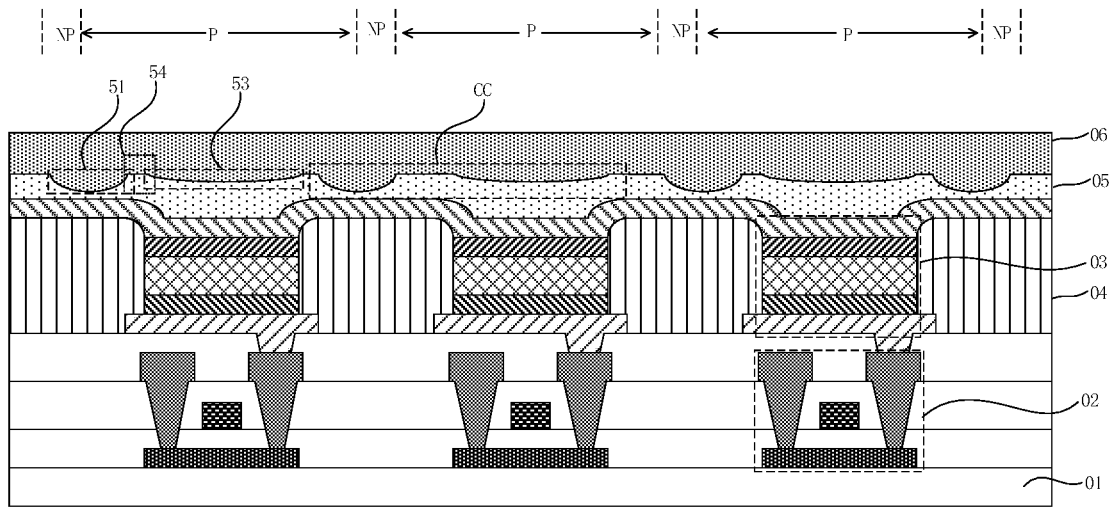
FIG. 10 is a cross-sectional view of an organic light-emitting display panel provided in an embodiment of the present disclosure.
Figure 11:
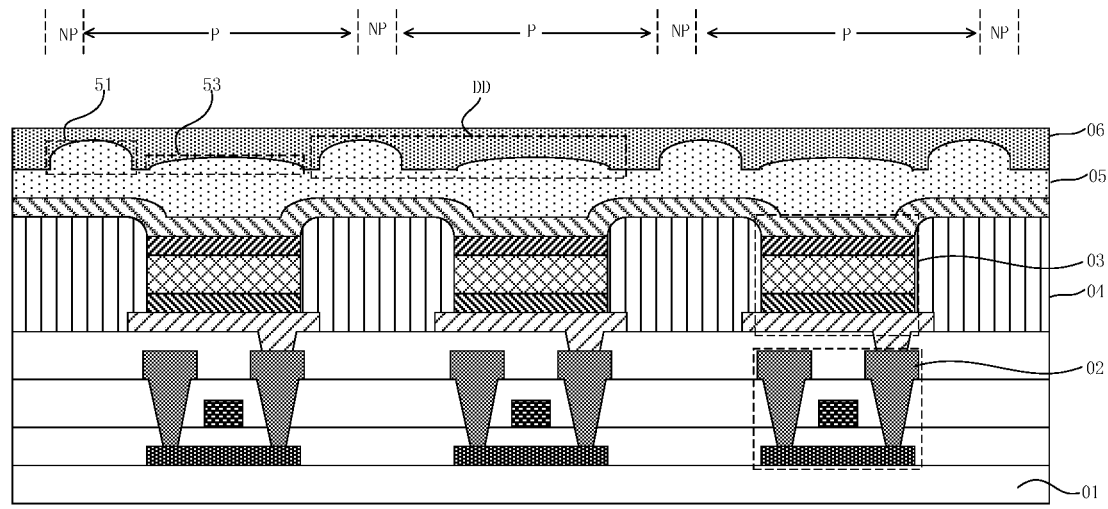
FIG. 11 is a cross-sectional view of an organic light-emitting display panel provided in an embodiment of the present disclosure.
Figure 12:
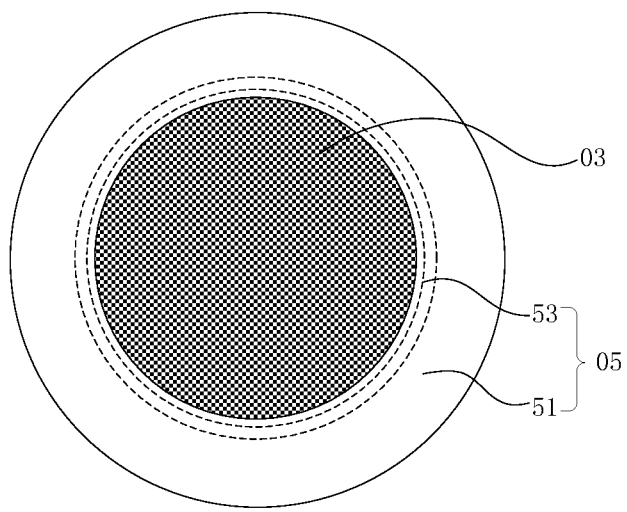
FIG. 12 is a diagram showing an orthogonal projection of a first microlens of an organic light-emitting display panel provided in an embodiment of the present disclosure.

FIG. 10 is a cross-sectional view of an organic light-emitting display panel provided in an embodiment of the present disclosure. FIG. 11 is a cross-sectional view of an organic light-emitting display panel provided in an embodiment of the present disclosure. FIG. 12 is a diagram showing an orthogonal projection of a first microlens of an organic light-emitting display panel provided in an embodiment of the present disclosure.

As shown in FIG. 10, FIG. 11, and FIG. 12, the microlens layer 05 further includes a plurality of second microlenses 53, and an orthogonal projection of the second microlens 53 on the base substrate 01 covers the orthogonal projection of the light-emitting unit 03 on the base substrate 01. The refractive index matching layer 06 also covers the second microlenses 52. The second microlens 53 has a second curved surface that is in contact with the refractive index matching layer 06, and the second curved surface protrudes toward one of the microlens layer 05 and the refractive index matching layer 06, which has a smaller refractive index.

In an embodiment, as shown in FIG. 10, when a refractive index of the second microlens 53 is smaller than the refractive index of the refractive index matching layer 06, the second curved surface of the second microlens 53 that is in contact with the refractive index matching layer 06 is a curved surface protruding toward the second microlens 53, that is, the second microlens 53 is a concave lens. As shown in FIG. 11, when the refractive index of the refractive index matching layer 06 is smaller than the refractive index of the second microlens 53, the second curved surface of the second microlens 53 that is in contact with the refractive index matching layer 06 is a curved surface protruding toward the refractive index matching layer 06, that is, the second microlens 53 is a convex lens.

The orthogonal projection of the second microlens 53 on the base substrate 01 covers the orthogonal projection of the light-emitting unit 03 on the base substrate 01.

In an embodiment of the present disclosure, the microlens layer 05 is a continuous undivided planar structure. Correspondingly, the refractive index matching layer 06 is also a continuous undivided planar structure, and the microlens layer 05 covers the refractive index matching layer 06.

The second microlens 53 is provided at a region of the microlens layer 05 over the light-emitting unit 03, and at least part of large-angle light emitted by the light-emitting unit 03 can be converted into small-angle light, avoiding total reflection and improving the light-emitting efficiency.

Referring to FIG. 10 and FIG. 11, in a vicinity of the same first opening 41, namely in one light-emitting part P, a curved surface height of the first curved surface of the first microlens 51 that is in contact with the refractive index matching layer 06 is greater than a curved surface height of the second curved surface of the second microlens 53 that is in contact with the refractive index matching layer 06.

Figure 13:
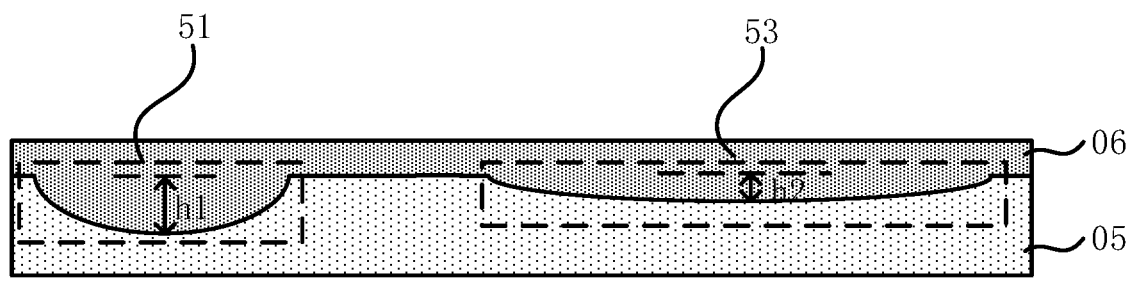
FIG. 13 is an enlarged view of a region CC shown in FIG. 10.
Figure 14:
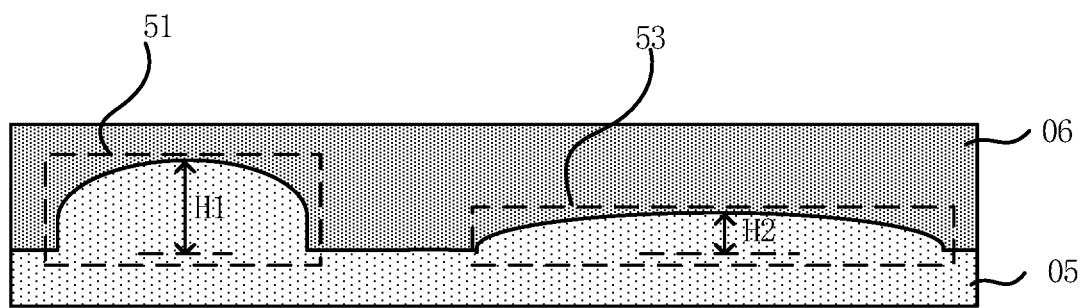
FIG. 14 is an enlarged view of a region DD shown in FIG. 11.

FIG. 13 is an enlarged view of a region CC shown in FIG. 10. FIG. 14 is an enlarged view of a region DD shown in FIG. 11.

A curved surface height of a curved surface is a maximum depth of curved surface protruding or recessing in a direction perpendicular to a plane of the display panel. Referring to FIG. 10 and FIG. 13, when both the first microlens 51 and the second microlens 53 are concave lenses, a curved surface height of the first curved surface of the first microlens 51 is h1, a curved surface height of the second curved surface of the second microlens 53 is h2, and h1 is greater than h2.

Referring to FIG. 11 and FIG. 14, when both the first microlens 51 and the second microlens 53 are convex lenses, the curved surface height of the first curved surface of the first microlens 51 is H1, the curved surface height of the second curved surface of the second microlens 53 is H2, and H1 is greater than H2.

When the curved surface height of the first curved surface is greater than the height of the second curved surface, a refraction degree of light by the first microlens 51 is greater than a refraction degree of the light by the second microlens 53, that is, a change degree of an angle of the light by the first microlens 51 is greater than a change degree of an angle of the light by the second microlens 53. The probability of large-angle light occurring at the corresponding position of the light-emitting unit 03 is small, and a maximum angle of the large-angle light is generally smaller than a maximum angle of the large-angle light located at other positions, so the second microlens 53 converts the large-angle light into the small-angle light, the angle of the small-angle light is not changed significantly, and the divergence of a front-screen-view light which affects the display effect is avoided.

Figure 15:
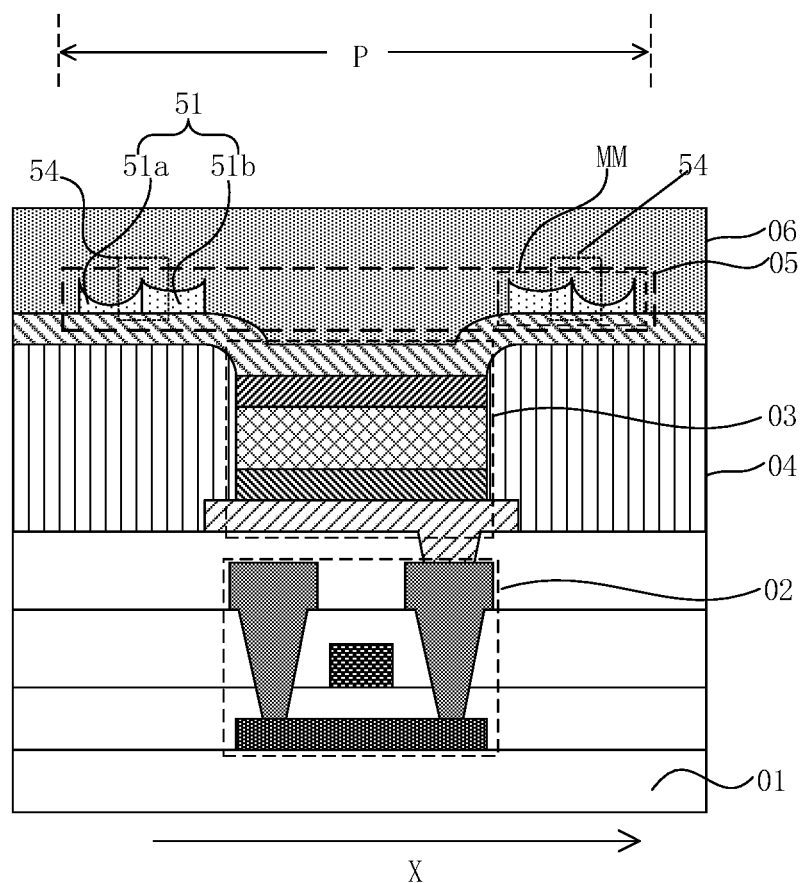
FIG. 15 is a schematic diagram of a light-emitting part of an organic light-emitting display panel provided in an embodiment of the present disclosure.
Figure 16:
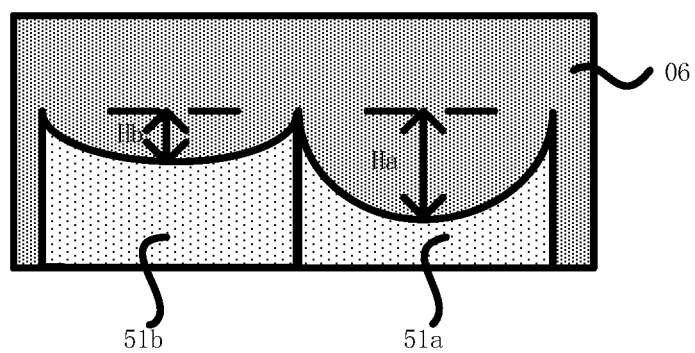
FIG. 16 is an enlarged view of a region MM shown in FIG. 15.

FIG. 15 is a schematic diagram of a light-emitting part of an organic light-emitting display panel provided in an embodiment of the present disclosure. FIG. 16 is an enlarged view of a region MM shown in FIG. 15. The organic light-emitting display panel provided by the present disclosure includes multiple light-emitting parts P. The features shown in FIG. 13 can be applied to all light-emitting parts P, or can be applied to only part of the light-emitting parts P. As shown in FIG. 10 and FIG. 15, the microlens layer 05 is arranged at a side of the pixel definition layer 04 facing away from the base substrate 01 and includes at least one first sub-microlens 54. The first sub-microlens protrudes along a direction from the base substrate 01 to the microlens layer 05. An orthogonal projection of the first sub-microlens 54 on the base substrate 01 overlaps with an orthogonal projection of the pixel definition layer 04 on the base substrate 01.

As shown in FIG. 15, multiple first microlenses 51 are provided in the region located between two adjacent first openings 41, that is, along the first direction X, multiple first microlenses 51 are provided in at least part of the light-emitting parts P. The first direction X is a direction along which the two adjacent light-emitting parts P are arranged. In other words, when the first microlens 51 has a ring-shaped structure, at least two nested first microlenses 51 are provided in the light-emitting part P shown in FIG. 15. When the first microlense 51 has the shape of a ring, at least two rings of first microlenses 51 are provided in the light-emitting part P shown in FIG. 15. In some embodiments, at least two first sub-microlenses 54 are arranged between a region between two adjacent first openings 41 along the first direction X, and the two adjacent first openings 41 are arranged along the first direction X. In some embodiments, for the first sub-microlenses 54 located between the region between the two adjacent first openings 41, one first sub-microlens 41 that is close to the light-emitting unit 03 has a greater protruding height than a protruding height of another first sub-microlens 54 that is far away from this light-emitting unit 03.

As shown in FIG. 15, among the multiple first microlenses 51 corresponding to one opening, the curved surface height of the first curved surface of one first microlens 51 closer to the light-emitting unit 03 than another first microlens 51 is smaller than the curved surface height of the first curved surface of the another first microlens 51. That is, among the multiple first microlenses 51 located in one light-emitting part P, the curved surface height of the first curved surface of one first microlens 51 closer to the light-emitting unit 03 than another first microlens 51 is smaller than the curved surface height of the first curved surface of the another first microlens 51. That is, among the multiple first microlenses 51 in one light-emitting part P, the smaller a distance of the first microlens 51 from the light-emitting unit 03, the smaller the curved surface height of the first curved surface of the first microlens 51 that is in contact with the refractive index matching layer 06.

As shown in FIG. 15 and FIG. 16, a first microlens 51a and a first microlens 51b are provided in the same light-emitting part P, the first microlens 51a is farther away from the light-emitting unit 03 and its first curved surface has a curved surface height of Ha, and the first microlens 51b is closer to the light-emitting unit 03 and its first curved surface has a curved surface height Hb, and Ha is greater than Hb.

The greater the distance from the light-emitting unit 03, the larger the probability of the large-angle light occurring, and the more apparent the influence to the adjacent light-emitting part P. By increasing the curved surface height of the first curved surface of the first microlens 51 farther away from the light-emitting unit 03, the changing degree to the angle of light by the first microlens 51 is increased, it is ensured that more large-angle light is converted into small-angle light, and the light emitting efficiency of the light-emitting part is ensured.

Figure 17:
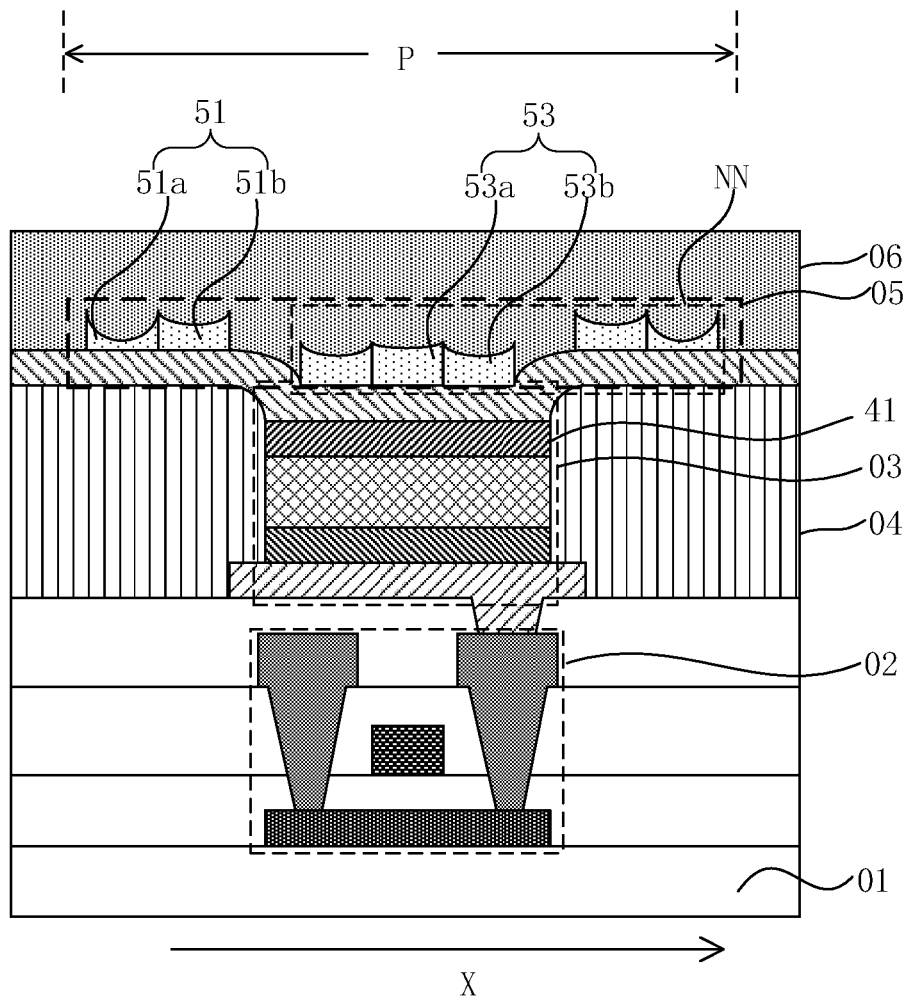
FIG. 17 is a schematic diagram of a light-emitting unit of an organic light-emitting display panel provided in an embodiment of the present disclosure.
Figure 18:
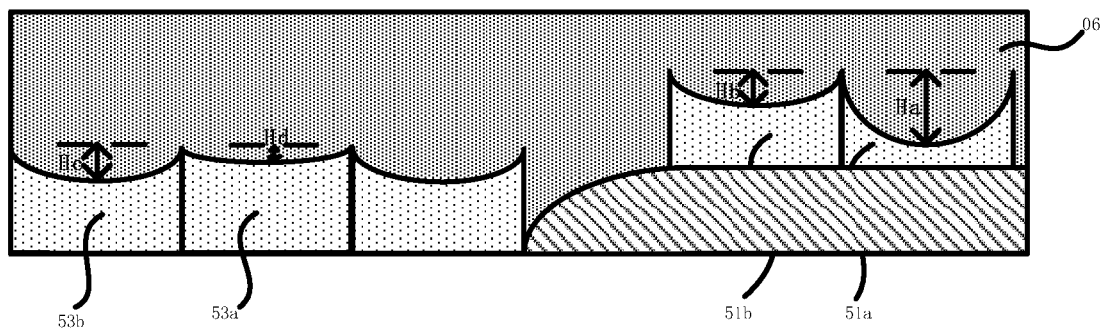
FIG. 18 is an enlarged view of a region NN shown in FIG. 17.

FIG. 17 is a schematic diagram of a light-emitting part of an organic light-emitting display panel provided in an embodiment of the present disclosure. FIG. 18 is an enlarged view of a region NN shown in FIG. 17. It should be noted that the organic light-emitting display panel provided by the present disclosure includes multiple light-emitting parts P. The feature shown in FIG. 15 can be applied to all light-emitting parts P, or can be applied to only part of the light-emitting parts P.

As shown in FIG. 17, in the vicinity of the same first opening 41, the curved surface height of the second curved surface corresponding to the second microlens 53 is smaller than the curved surface height of the second curved surface corresponding to the second microlens 53 farther away from the light-emitting unit 03. That is, one light-emitting part P includes multiple second microlenses 53, and in one light-emitting part P, the curved surface height of the second curved surface of one second microlens 53 closer to the light-emitting unit 03 than another second microlens 53 is smaller than the curved surface height of the second curved surface of the another second microlens 53. In other words, among the multiple second microlenses 53 in the one light-emitting part P, the smaller the distance of the second microlens 53 from the light-emitting unit 03, the smaller the curved surface height of the second curved surface of the second microlens 53 that is in contact with the refractive index matching layer 06.

As shown in FIG. 17 and FIG. 18, the second microlens 53a and the second microlens 53b are provided in one light-emitting part P. The second microlens 53a is farther away from the light-emitting unit 03 and its second curved surface has a curved surface height Hc, and the second microlens 53b is closer to the light-emitting unit 03 and its second curved surface has a curved surface height Hd, and Hc is greater than Hd.

In an embodiment of the present disclosure, when both the first microlenses 51 and the second microlenses 53 are provided in one light-emitting part P, a minimum value of the curved surface heights of the first curved surfaces of the first microlenses 51 is greater than a maximum value of the curved surface heights of the second curved surfaces of the second microlenses 53. As shown in FIG. 15 and FIG. 16, Hb is greater than Hc.

The farther a distance from the light-emitting unit 03, the larger the probability of the large-angle light occurring. By increasing the curved surface height of the second curved surface of the second microlens 53 farther away from the light-emitting unit 03, the changing degree to the angle of light by the second microlens 53 is increased, it is ensured that more large-angle light are converted into small-angle light and exits the display panel, and the light emitting efficiency of the light-emitting part is ensured.

Figure 19:
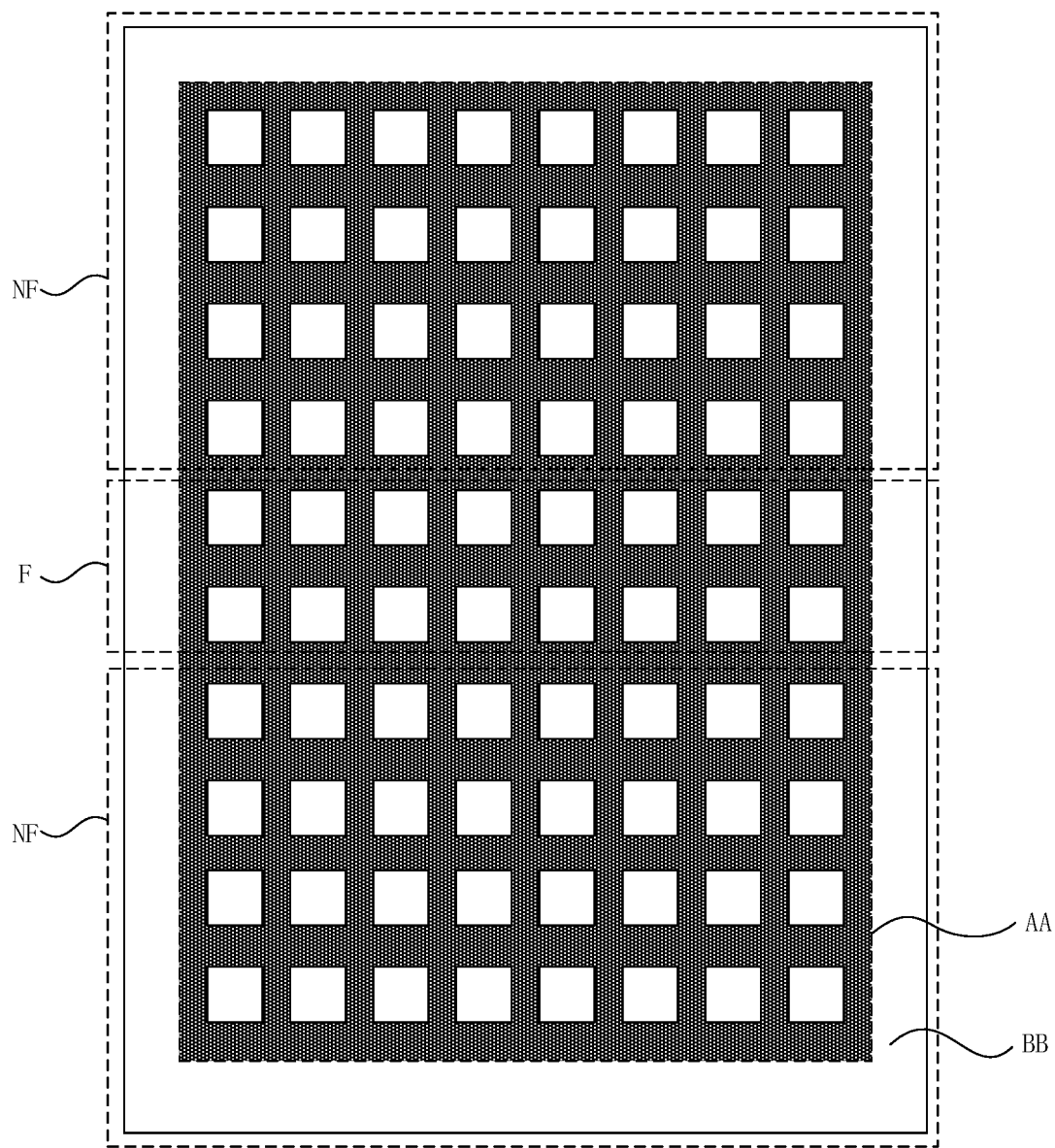
FIG. 19 is a schematic diagram of an organic light-emitting display panel provided in an embodiment of the present disclosure.

FIG. 19 is a schematic diagram of an organic light-emitting display panel provided in an embodiment of the present disclosure. The organic light-emitting display panel provided by an embodiment of the present disclosure can include a bending region F and a non-bending region NF. Correspondingly, the plurality of light-emitting units includes a plurality of first light-emitting units and a plurality of second light-emitting units, and the plurality of first openings includes a plurality of first sub-openings and a plurality of second sub-openings. That is, the plurality of light-emitting parts P includes a plurality of first light-emitting sub-parts and a plurality of second light-emitting sub-parts. A minimum distance between the first light-emitting unit and a central bending line of the bending region F is smaller than a minimum distance between the second light-emitting unit and the central bending line of the bending region F. That is, a minimum distance between the first light-emitting sub-part and the central bending line of the bending region F is smaller than a minimum distance between the second light-emitting sub-part and the central bending line of the bending region F.

It should be noted that the non-bending region NF can be provided at two sides of the bending region F, as shown in FIG. 19. In an embodiment, the non-bending region is located at one side of the bending region F. The relative positions of the non-bending area NF and the bending area F are not limited in the present disclosure, and the bending region F is a bendable region of the display panel.

It should be noted that the first light-emitting unit and the second light-emitting unit are described in a relative manner, that is, the first light-emitting part and the second light-emitting part are described in a relative manner. As shown in FIG. 19, for one light-emitting part P in the bending region F and one light-emitting part P in the non-bending region NF, the light-emitting part in the bending region F is the first light-emitting sub-part, and the light-emitting part P in the non-bending region NF is the second light-emitting sub-part. In an embodiment, two light-emitting parts P in the bending region F can be classified into the first light-emitting sub-part and the second light-emitting sub-part according to their distances from the central bending line of the bending region F. Similarly, two light-emitting parts P in the non-bending region NF can be classified into the first light-emitting sub-part and the second light-emitting sub-part according to their distances to the central bending line of the bending region F.

Figure 20:
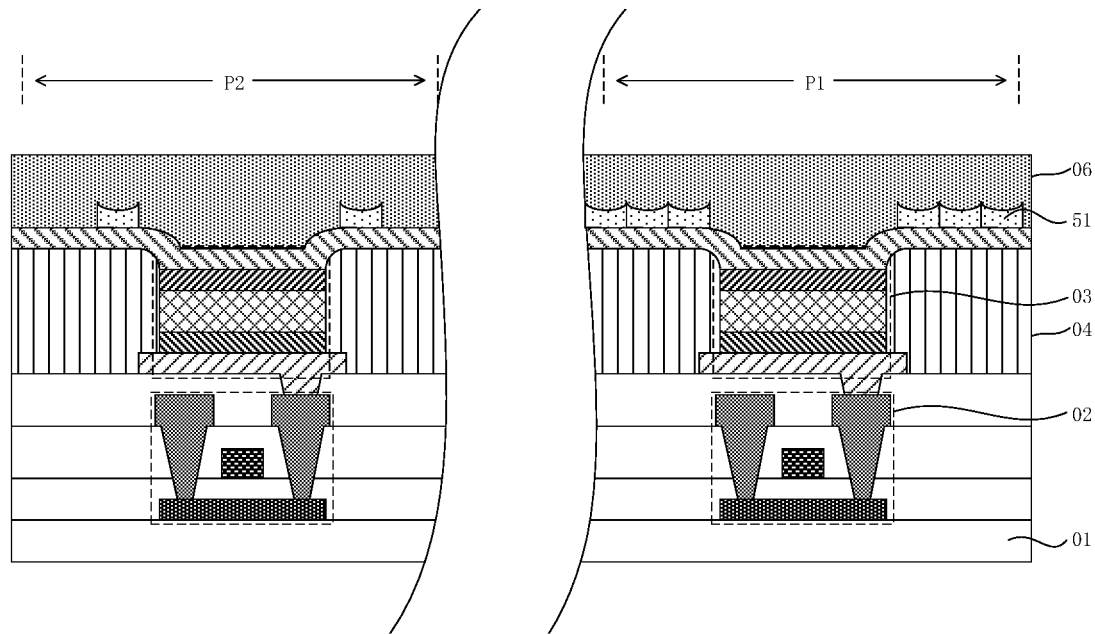
FIG. 20 is a cross-sectional view of the organic light-emitting display panel shown in FIG. 19.

FIG. 20 is a cross-sectional view of the organic light-emitting display panel shown in FIG. 19.

As shown in FIG. 20, the number of the first microlenses 51 in the vicinity of the first sub-opening is greater than the number of the first microlenses 51 located in a vicinity of the second sub-opening. That is, the number of the first microlenses 51 provided in the first light-emitting sub-part P1 is greater than the number of the first microlenses 51 provided in the second light-emitting sub-part. In some embodiments, the number of at least one first sub-microlens 54 located in a vicinity of the first sub-opening is greater than the number of another at least one first sub-microlens 54 located in a vicinity of the second sub-opening.

The closer to the bending region F, the larger the difference between a bending angle and a deviation angle between the light and a centre of the light-emitting unit 03, that is, with the increase of the large-angle light, by providing more first microlenses in the position closer to the bending region F, the change of the light exiting angle caused by bending can be effectively improved.

Based on the same principle, the number of the second microlenses 53 over the first light-emitting unit is greater than the number of the second microlenses 53 over the second light-emitting unit. That is, the number of the second microlenses 53 in the first light-emitting sub-part P1 is greater than the number of the second microlenses 53 provided in the second light-emitting sub-part P2.

Figure 21:
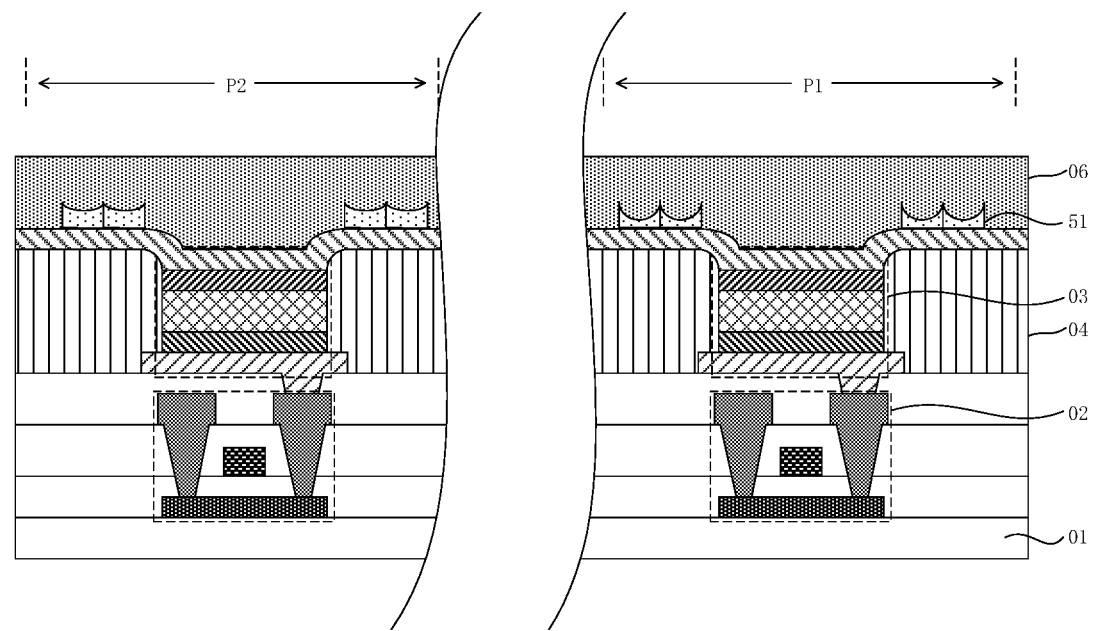
FIG. 21 is an cross-sectional view of the organic light-emitting display panel shown in FIG. 19.

FIG. 21 is a cross-sectional view of the organic light-emitting display panel shown in FIG. 19.

As shown in FIG. 21, the curved surface height of the first curved surface of the first microlens 51 in the vicinity of the first sub-opening is greater than the curved surface height of the first curved surface of the first microlens 51 provided in the vicinity of the second sub-opening. That is, the curved surface height of the first curved surface of the first microlens 51 in the first light-emitting sub-part is greater than the curved surface height of the first curved of the first microlens 51 provided in the second light-emitting sub-part. In some embodiments, a protruding height of one first sub-microlens 54 that is located in a vicinity of one first sub-opening is greater than a protruding height of another first sub-microlenses 54 that is located in a vicinity of one second sub-opening.

The closer to the bending region F, the larger the difference between a bending angle and a deviation angle between the light and the central of the light-emitting unit 03, that is, the more the large-angle light. By increasing the curved surface height of the first curved surface of the first microlens in the position closer to the bending region F, the change of the light emergent angle caused by bending can be effectively improved.

Based on the same principle, the curved surface height of the second curved surface of the second microlens 53 over the first light-emitting unit is greater than the curved surface height of the second curved surface of the second microlens 53 over the second light-emitting unit. That is, the curved surface height of the second curved surface of the second microlens 53 in the first light-emitting sub-part P1 is greater than the curved surface height of the second curved surface of the second microlens 53 provided in the second light-emitting sub-part P2.

Figure 22:
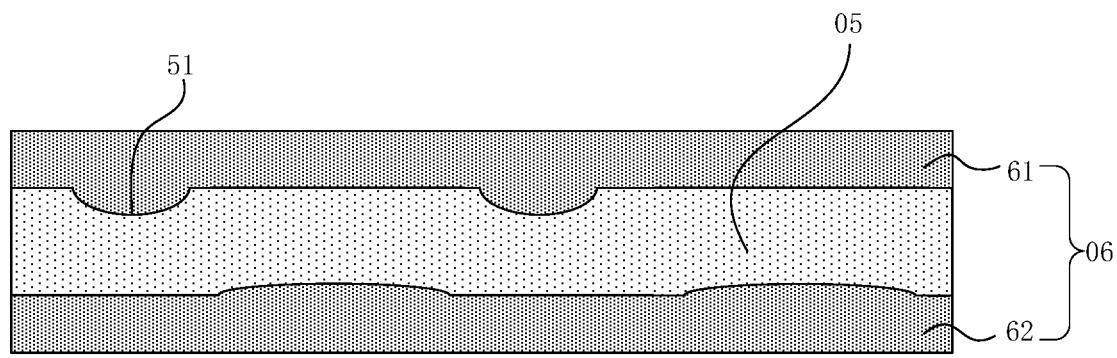
FIG. 22 is a schematic diagram showing a microlens layer and a refractive index matching layer provided in an embodiment of the present disclosure.

FIG. 22 is a schematic diagram of a microlens layer and a refractive index matching layer provided in an embodiment of the present disclosure.

In an embodiment of the present disclosure, as shown in FIG. 10 and FIG. 11, the refractive index matching layer 06 is located at a side of the microlens layer 05, and a direction towards which the first curved surface of the first microlens 51 towards is the same as a direction towards which the second curved surface of the second microlens 52.

In an embodiment of the present disclosure, as shown in FIG. 22, the refractive index matching layer 06 includes a first refractive index matching layer 61 and a second refractive index matching layer 62, and the microlens layer 05 is located between the first refractive index matching layer 61 and the second refractive index matching layer 62. The microlens still protrudes into one of the refractive index matching layer 06 and the microlens layer 05 that has a smaller refractive index. As shown in FIG. 20, two adjacent microlenses 51 can protrude in a direction facing towards or facing away from the first refractive index matching layer 61 and the second refractive index matching layer 62.

When the microlenses are densely arranged, the refractive index matching layer 06 is provided at two sides of the microlens layer 05, and the adjacent microlenes are disposed at two sides of the microlens layer 05, which reduces the fabrication difficulty of the microlens.

In an embodiment of the present disclosure, the direction towards which the first curved surface of the first microlens 51 protrudes is opposite to the direction towards which the second curved surface of the second microlens 53 protrudes. Taking FIG. 22 as an example, both the first microlens 51 and the second microlens 53 are concave lenses, the first curved surface protrudes downwardly, and the second curved surface protrudes upwardly. In some embodiments, the second microlens 53 protrudes towards a direction same as the protruding direction of the first sub-microlens 54. In some embodiments, the first sub-microlens 54 protrudes in a direction opposite to a direction towards which the second microlens 53 protrudes. In some embodiments, a protruding height of one second microlens 53 is greater than a protruding height of one first sub-microlens 54.

Figure 23:
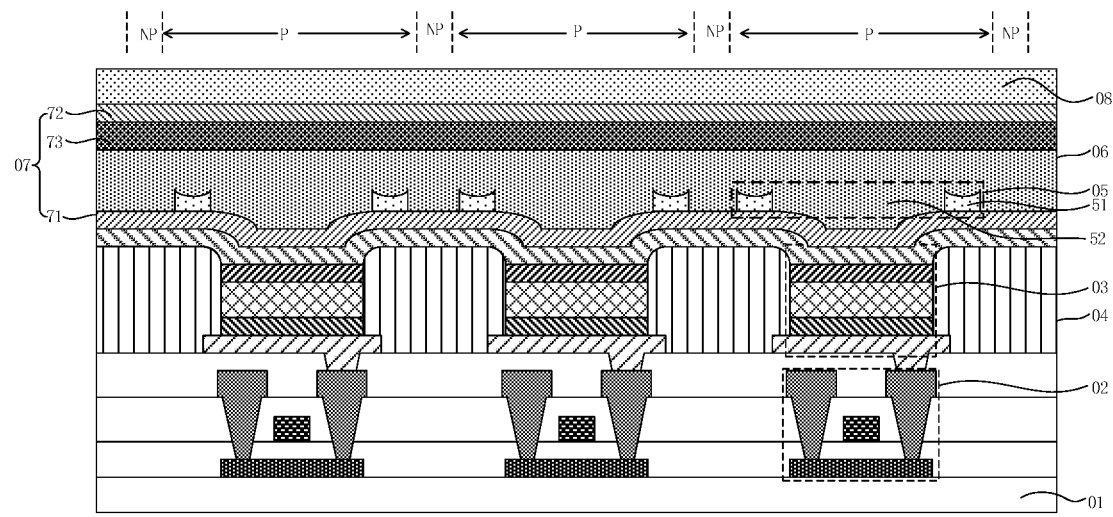
FIG. 23 is a cross-sectional view of an organic light-emitting display panel provided in an embodiment of the present disclosure.

FIG. 23 is a cross-sectional view of an organic light-emitting display panel provided in an embodiment of the present disclosure. As shown in FIG. 23, the organic light-emitting display panel further includes an encapsulation layer 07, and the encapsulation layer 07 covers the organic light-emitting layer and the pixel definition layer 04. The encapsulation layer 07 includes a first inorganic layer 71, a second inorganic layer 72 and a first organic layer 73 that are stacked together, and the first organic layer 73 is located between the first inorganic layer 71 and the second inorganic layer 72. The encapsulation layer 07 can prevent the external water and oxygen from eroding the light-emitting layer.

In an embodiment of the present disclosure, referring to FIG. 23, the microlens layer 05 and the refractive index matching layer 06 can be located between two layers of the encapsulation layer 07. For example, the microlens layer 05 and the refractive index matching layer 06 can be located between the first inorganic layer 71 and the first organic layer 73. In an embodiment of the present disclosure, the first inorganic layer 71 and at least one of the first microlens 51 and the second microlens 53 are formed into one piece. In an embodiment of the present disclosure, the refractive index matching layer 06 can be reused as the first organic layer 73.

Referring to FIG. 23, the organic light-emitting display panel further includes a touch layer 08 and the touch layer 08 covers the organic light-emitting layer and the pixel definition layer 04. The touch layer 08 includes a touch electrode layer, and the touch electrode layer includes a plurality of touch electrodes which is insulated from each other. In an embodiment of the present disclosure, as shown in FIG. 23, the touch layer 08 is located at a side of the encapsulation layer 07 close to the light exiting side of the organic light-emitting display panel. Since the encapsulation layer 07 is located between the touch layer 08 and the light-emitting unit 03, the distance between the touch electrode in the touch layer 08 and the cathode 32 of the light-emitting unit 03 is increased, which reduces the parasitic capacitance between the touch electrode and the cathode.

Figure 24:
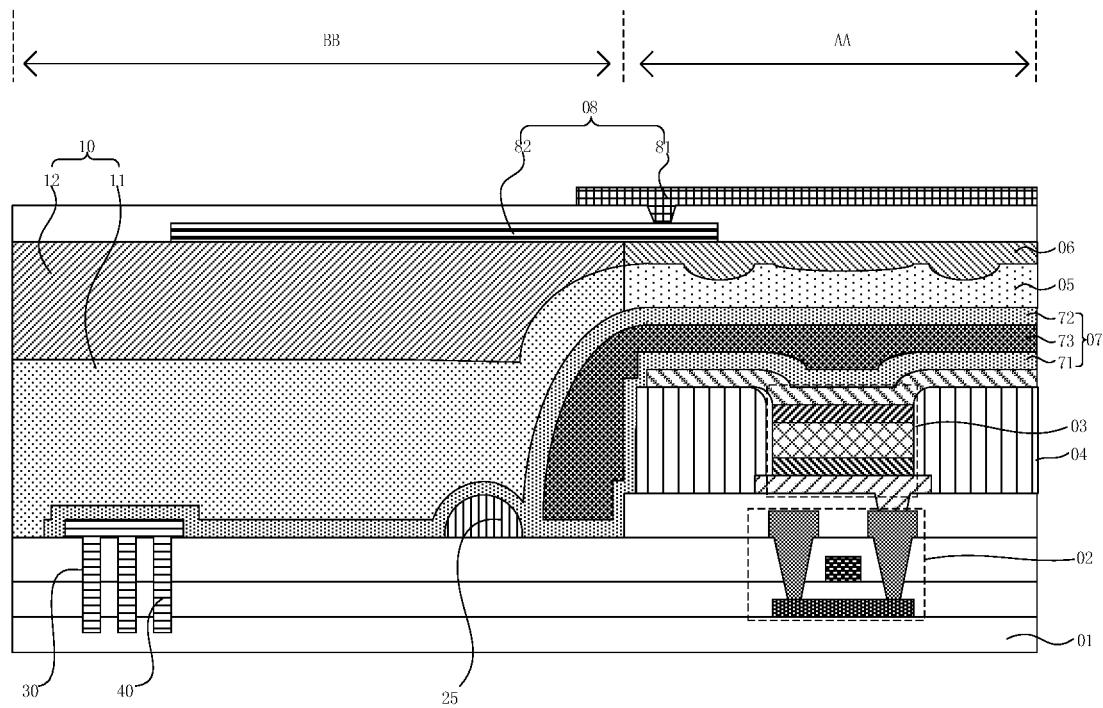
FIG. 24 is a cross-sectional view of an organic light-emitting display panel provided in an embodiment of the present disclosure.

FIG. 24 is a cross-sectional view of an organic light-emitting display panel provided in an embodiment of the present disclosure. As shown in FIG. 24, the microlens layer 05 and the refractive index matching layer 06 are located at a side of the encapsulation layer 07 close to the light exiting surface of the organic light-emitting display panel.

The encapsulation layer 07 extends from the display area AA to a part of the non-display area BB. Referring to FIG. 24, a barrier wall 25 is provided in the non-display area BB. The barrier wall 25 can block the transmission path of the external water and oxygen to ensure the reliability of the organic light-emitting display panel. The first organic layer 73 extends from the display area AA to a region located between the barrier wall 25 and the display area AA, that is, when the encapsulation layer 07 extends from the display area AA to the non-display area BB, the first organic layer 73 stops and does not reach the barrier wall 25.

As shown in FIG. 24, in the organic light-emitting display panel provided by an embodiment of the present disclosure, a via 30 is provided in an inorganic layer located in the non-display area BB, and the via 30 is arranged at a side of the barrier wall 25 facing away from the display area AA. Since the inorganic layer is brittle, cracks are likely generated in the inorganic layer in the process of cutting to form the organic light-emitting display panel. By providing a via 30 in the inorganic layer in the non-display area BB, the via 30 can prevent the cracks from extending to the display area AA. In an embodiment, the via 30 can be filled with organic materials to more effectively prevent the cracks from extending into the display area AA. As shown in FIG. 24, the via 30 can be filled with a filling structure 40, and the filling structure 40 can be made of the same material as at least one of the microlens layer 05 and the refractive index matching layer 06 and fabricated simultaneously with the at least one of the microlens layer 05 and the refractive index matching layer 06.

Please continue to refer to FIG. 24, in an embodiment of the present disclosure, a filling layer 10 is provided in the non-display area BB, and is located at a side of the inorganic layer close to the light exiting surface of the organic light-emitting display panel. The filling layer 10 is made of a same material as at least one of the microlens layer 05 and the refractive index matching layer 06. As shown in FIG. 24, the filling layer 10 includes a first filling layer 11 and a second filling layer 12 that are stacked together. The first filling layer 11 and the microlens layer 05 are made of the same material. The second filling layer 12 and the refractive index matching layer 06 are made of the same material. It should be noted that a filling pattern of the second filling layer 12 is different from a filling pattern of the refractive index matching layer 06 in FIG. 24, which is used for distinguishing the positions and structures of the second filling layer 12 and the refractive index matching layer 06 and is not intend to indicate they are made of different materials. A filling pattern of the first filling layer 11 and a filling pattern of the microlens layer 05 are different, which is used for distinguishing their positions and structures and is not intend to indicate they are made of different materials.

More layers are provided in the display area AA than in the non-display area BB. For example, the organic light-emitting layer is not provided in the non-display area BB, and the filling layer 10 is not provided in the non-display area BB. In this case, in a thickness direction of the organic light-emitting display panel, there is a step between the display area AA and the non-display area BB, which causes a structure designed to be continuous in both the display area AA and the non-display area BB not be continuous due to the step. For example, a signal line needs to climb at the boundary between the display area AA and the non-display area BB, and thus the signal line has a breaking risk, and/or an optical adhesive needs to climb at the boundary between the display area AA and the non-display area BB, and thus the optical adhesive has a breaking risk. By providing the filling layer 10 in the non-display area BB, the thickness step at the boundary between the display area AA and the non-display area BB caused by their thickness difference in the refractive index matching layer 06 or the microlens 05 is removed, which is beneficial to manufacturing the subsequent layers or wires and ensures the yield. In an embodiment, in the non-display area BB, the filling layer 10 and at least one of the microlens layer 05 and the refractive index matching layer 06 are formed in a same layer, and thus the filling layer 10 and the at least one of the microlens layer 05 and the refractive index matching layer 06 can be simultaneously formed, simplifying the process flow.

Still referring to FIG. 24, the touch layer 08 includes a touch electrode 81 and a touch wire 82 electrically connected to the touch electrode 81. The touch electrode 81 is configured to sense a touch operation, and the touch wire 82 is configured to transmit a touch signal for the touch electrode 81. It should be noted that the touch electrode 81 can be used in self-capacitance touch and also can be used in mutual capacitance touch.

As shown in FIG. 24, the touch layer 08 is arranged at the side of the refractive index matching layer 06 close to the light exiting surface of the organic light-emitting surface. That is, at least the refractive index matching layer 06 and the microlens 05 are provided between the touch layer 08 and the organic light-emitting layer. In an embodiment, the encapsulation layer 07 is also be provided between the touch layer 08 and the organic light-emitting layer. In this way, the distance between the touch electrode 81 in the touch layer 08 and the cathode 32 of the light-emitting unit 03 is increased, which can reduce the parasitic capacitance between the touch electrode 82 and the cathode 32. In an embodiment, the touch wire 82 extends from the display area AA to the non-display area BB, the touch layer 08 is located above the refractive index matching layer 06, and the touch wire 82 in the non-display area BB is located above the filling layer 10. In this way, when the touch wire 82 extends from the display area AA to the non-display area BB, there is no step, thereby ensuring continuity of the touch wire 82.

Figure 25:
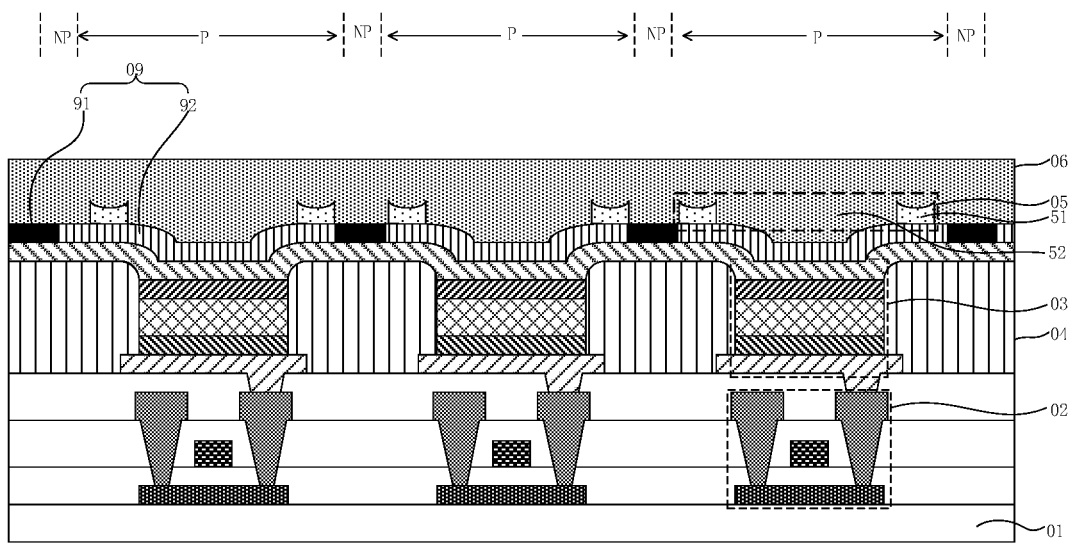
FIG. 25 is a cross-sectional view of an organic light-emitting display panel provided in an embodiment of the present disclosure.

FIG. 25 is a cross-sectional view of an organic light-emitting display panel provided in an embodiment of the present disclosure.

As shown in FIG. 25, the pixel definition layer 04 extends from the light-emitting part P to the non-light-emitting part NP. The organic light-emitting display panel further includes a color resist layer 09. The color resist layer 09 includes multiple color resists 92 and a black matrix 91. The color resist layer is located at a side of the organic light-emitting layer close to the light exiting surface of the organic light-emitting panel. An orthogonal projection of the color resist 92 on the base substrate 01 covers the orthogonal projection of the light-emitting unit 03 on the base substrate 01. An orthogonal projection of the black matrix 91 on the base substrate 01 is located between orthogonal projections of two adjacent color resists 92 on the base substrate 01. In addition, as shown in FIG. 25, the orthogonal projection of the black matrix 91 on the base substrate 01 is located in the orthogonal projection of the non-light-emitting part NP on the base substrate 01, and the orthogonal projection of the color resist 92 on the base substrate 01 covers the orthogonal projection of the light-emitting part P on the base substrate 01.

As shown in FIG. 25, the color resist layer 09 is located between the light-emitting layer and the microlens layer 05. The color resist layer 09 can improve the color purity of light passing through the color resist layer 09. The black matrix and the first microlens 5a can combined with each other, which can reduce the exiting of stray light.

Figure 26:
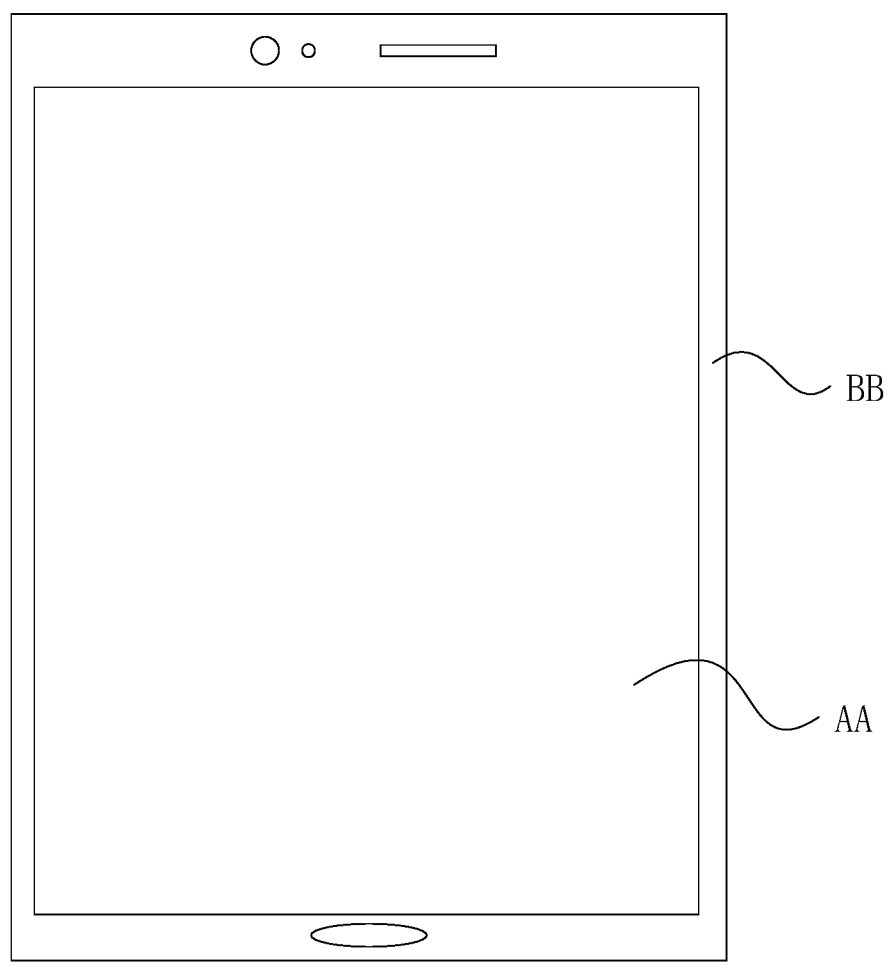
FIG. 26 is a schematic diagram of an organic light-emitting display device provided in an embodiment of the present disclosure.

FIG. 26 is a schematic diagram of an organic light-emitting display device provided in an embodiment of the present disclosure. As shown in FIG. 26, the organic light-emitting display device provided in the embodiment of the present disclosure includes the organic light-emitting display panel described in any above embodiment. The organic light-emitting display device can be a mobile phone, or any electronic apparatus having a display function such as a tablet computer, or a television. As shown in FIG. 26, the organic light-emitting display device provided in the embodiment of the present disclosure includes the display area AA corresponding to the organic light-emitting display panel and the non-display area BB corresponding to the organic light-emitting display panel.

In an embodiment of the present disclosure, the organic light-emitting display panel of the organic light-emitting display device is a curved surface structure, that is, the organic light-emitting display panel is a display panel with a fixed curved surface, and correspondingly, the organic light-emitting display device is a display device in a fixed curved surface shape.

In an embodiment of the present disclosure, the organic light-emitting display panel of the organic light-emitting display device provided in the present disclosure is a flexible display panel, that is, the organic light-emitting display panel can be bent to obtain a desired shape, and correspondingly, the organic light-emitting display device can be bent to obtain a desired shape.

In the display device provided by embodiments of the present disclosure, the first microlenses are provided in the peripheral region of the light-emitting unit, such that large-angle light emitted from the light-emitting unit is changed to small-angle light and can exist from the light-emitting part, thereby avoiding a color mixing caused by the large-angle light entering the adjacent light-emitting parts.

The embodiments described above are embodiments of the present disclosure, but not intended to limit the present disclosure. Any modifications, equivalent substitutions, improvements, etc., which are made within the spirit and principles of the present disclosure, should be included in the protection scope of the present disclosure.

What is claimed is:

1. An organic light-emitting display panel having a display area and a non-display area, the organic light-emitting display panel comprising:
    a base substrate;
    an organic light-emitting layer arranged at a side of the base substrate and comprising a plurality of light-emitting units;
    a pixel definition layer comprising a plurality of first openings, one light-emitting unit of the plurality of light-emitting units being located in one of the plurality of first openings;
    a microlens layer arranged at a side of the pixel definition layer facing away from the base substrate and comprising at least one first sub-microlens; and
    a refractive index matching layer located on a side of the microlens layer facing away from the base substrate, wherein a refractive index of the refractive index matching layer is greater than a refractive index of the microlens layer,
    wherein one first sub-microlens of the at least one first sub-microlens protrudes along a direction from the base substrate to the microlens layer; and
    wherein an orthogonal projection of one first sub-microlens of the at least one first sub-microlens on the base substrate at least partially overlaps with an orthogonal projection of the pixel definition layer on the base substrate.

2. The organic light-emitting display panel according to claim 1, further comprising:
    a thin film transistor layer located between the base substrate and the organic light-emitting layer and comprising inorganic layers; and
    at least one filling layer located on a side of one the inorganic layers facing away from the base substrate, wherein the at least one filling layer is made of a same material as at least one of the refractive index matching layer or the microlens layer.

3. The organic light-emitting display panel according to claim 2, wherein the at least one filling layer includes a first filling layer and a second filling layer, wherein the first filling layer and the microlens layer are made of a same material, and the second filling layer and the refractive index matching layer are made of a same material.

4. The organic light-emitting display panel according to claim 3, further comprising:
    an encapsulation layer comprising at least one inorganic layer, wherein an edge of the first filling layer and an edge of the second filling layer are located at a side of an edge of the at least one inorganic layer away from the display area.

5. The organic light-emitting display panel according to claim 2, wherein at least one inorganic layer of the inorganic layers includes a via where a filling structure is filled, wherein the filling structure is made of a same material as at least one of the microlens layer or the refractive index matching layer.

6. The organic light-emitting display panel according to claim 1, wherein the refractive index matching layer comprises at least one second sub-microlens each protruding along a direction from the pixel definition layer to the base substrate, wherein an orthogonal projection of one of the at least one second sub-microlens on the base substrate overlaps with an orthogonal projection of one of the plurality of light-emitting units on the base substrate.

7. The organic light-emitting display panel according to claim 1, wherein the microlens layer further comprises at least one second opening, wherein an orthogonal projection of one of the at least one second opening on the base substrate at least partially overlaps with an orthogonal projection of one of the plurality of light-emitting units on the base substrate.

8. The organic light-emitting display panel according to claim 7, wherein the at least one first sub-microlens comprises a plurality of first sub-microlenses, wherein at least two first sub-microlenses of the plurality of first sub-microlenses are arranged between a region between two adjacent first openings of the plurality of first openings along a first direction, wherein the two adjacent first openings are arranged along the first direction.

9. The organic light-emitting display panel according to claim 8, wherein for the at least two first sub-microlenses located between the region between the two adjacent first openings, one first sub-microlens of the at least two first sub-microlenses that is close to one light-emitting unit of the plurality of light-emitting units has a greater protruding height than a protruding height of another first sub-microlens of the at least two first sub-microlenses that is far away from the one light-emitting unit.

10. The organic light-emitting display panel according to claim 1, wherein one of the at least one first sub-microlens is of a ring structure, and an orthogonal projection of the one of the at least one first sub-microlens on the base substrate surrounds an orthogonal projection of one of the plurality of light-emitting units on the base substrate.

11. The organic light-emitting display panel according to claim 1, further comprising:
    a color resist layer disposed at a side of the organic light-emitting layer close to a light exiting surface of the organic light-emitting display panel, wherein the color resist layer comprises a plurality of color resists and a black matrix, wherein an orthogonal projection of one color resist of the plurality of color resists on the base substrate covers an orthogonal projection of one of the plurality of light-emitting units on the base substrate.

12. The organic light-emitting display panel according to claim 1, further comprising:
    an encapsulation layer comprising a first inorganic layer, a second inorganic layer and a first organic layer that are stacked together, the first organic layer being located between the first inorganic layer and the second inorganic layer; and a touch layer comprising a touch electrode layer and disposed at a side of the encapsulation layer close to a light exiting surface of the organic light-emitting display panel, wherein the encapsulation layer and the touch layer cover the organic light-emitting layer and the pixel definition layer, and wherein the touch electrode layer comprises a plurality of touch electrodes.

13. The organic light-emitting display panel according to claim 1, further comprising:

an encapsulation layer comprising a first inorganic layer, a second inorganic layer and a first organic layer that are stacked together, the first organic layer being located between the first inorganic layer and the second inorganic layer; and a touch layer comprising a touch electrode layer and disposed at a side of the encapsulation layer close to a light exiting surface of the organic light-emitting display panel, wherein the encapsulation layer and the touch layer cover the organic light-emitting layer and the pixel definition layer, and wherein the touch electrode layer comprises a plurality of touch electrodes.

14. An organic light-emitting display device, comprising:
an organic light-emitting display panel having a display area and a non-display area, wherein the organic light-emitting display panel comprises:

a base substrate;

an organic light-emitting layer arranged at a side of the base substrate and comprising a plurality of light-emitting units;

a pixel definition layer comprising a plurality of first openings, one light-emitting unit of the plurality of light-emitting units being located in one of the plurality of first openings;

a microlens layer arranged at a side of the pixel definition layer facing away from the base substrate and comprising at least one first sub-microlens; and a refractive index matching layer located on a side of the microlens layer facing away from the base substrate, wherein a refractive index of the refractive index matching layer is greater than a refractive index of the microlens layer, wherein one first sub-microlens of the at least one first sub-microlens protrudes along a direction from the base substrate to the microlens layer; and wherein an orthogonal projection of one first sub-microlens of the at least one first sub-microlens on the base substrate overlaps with an orthogonal projection of the pixel definition layer on the base substrate.

15. An organic light-emitting display panel having a display area and a non-display area, the organic light-emitting display panel comprising:

a base substrate;

an organic light-emitting layer arranged at a side of the base substrate and comprising a plurality of light-emitting units;

a pixel definition layer comprising a plurality of first openings, one light-emitting unit of the plurality of light-emitting units being located in one of the plurality of first openings;

a microlens layer arranged at a side of the pixel definition layer facing away from the base substrate and comprising at least one first sub-microlens;

a refractive index matching layer located on a side of the microlens layer facing away from the base substrate;

a thin film transistor layer located between the base substrate and the organic light-emitting layer and comprising inorganic layers;

at least one filling layer located on a side of one the inorganic layers facing away from the base substrate, wherein the at least one filling layer is made of a same material as at least one of the refractive index matching layer or the microlens layer, wherein one first sub-microlens of the at least one first sub-microlens protrudes along a direction from the base substrate to the microlens layer; and wherein an orthogonal projection of one first sub-microlens of the at least one first sub-microlens on the base substrate at least partially overlaps with an orthogonal projection of the pixel definition layer on the base substrate.

16. The organic light-emitting display panel according to claim 15, wherein the at least one filling layer includes a first filling layer and a second filling layer, wherein the first filling layer and the microlens layer are made of a same material, and the second filling layer and the refractive index matching layer are made of a same material.

17. The organic light-emitting display panel according to claim 16, further comprising:

an encapsulation layer comprising at least one inorganic layer, wherein an edge of the first filling layer and an edge of the second filling layer are located at a side of an edge of the at least one inorganic layer away from the display area.

18. The organic light-emitting display panel according to claim 15, wherein at least one inorganic layer of the inorganic layers includes a via where a filling structure is filled, wherein the filling structure is made of a same material as at least one of the microlens layer or the refractive index matching layer.

19. The organic light-emitting display panel according to claim 15, wherein the refractive index matching layer comprises at least one second sub-microlens each protruding along a direction from the pixel definition layer to the base substrate, wherein an orthogonal projection of one of the at least one second sub-microlens on the base substrate overlaps with an orthogonal projection of one of the plurality of light-emitting units on the base substrate.

20. An organic light-emitting display device, comprising the organic light-emitting display panel according to claim 15.

* * * * *